United States Patent
Charisoulis et al.

(10) Patent No.: US 12,254,799 B2
(45) Date of Patent: Mar. 18, 2025

(54) TANDEM MICRO-LIGHT EMITTING DIODE REDUNDANCY ARCHITECTURE

(71) Applicant: Apple Inc., Cupertino, CA (US)

(72) Inventors: Thomas Charisoulis, San Carlos, CA (US); Saif Choudhary, San Jose, CA (US); Xia Li, San Jose, CA (US); Tore Nauta, Santa Cruz, CA (US); Kapil V Sakariya, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/887,148

(22) Filed: Aug. 12, 2022

(65) Prior Publication Data

US 2023/0086380 A1 Mar. 23, 2023

Related U.S. Application Data

(60) Provisional application No. 63/247,201, filed on Sep. 22, 2021.

(51) Int. Cl.
G09G 3/00 (2006.01)
H01L 21/66 (2006.01)
H01L 25/16 (2023.01)

(52) U.S. Cl.
CPC ............ *G09G 3/006* (2013.01); *H01L 22/22* (2013.01); *H01L 22/32* (2013.01); *G09G 2320/0233* (2013.01); *G09G 2320/0626* (2013.01); *G09G 2330/021* (2013.01); *G09G 2330/08* (2013.01); *H01L 25/167* (2013.01)

(58) Field of Classification Search
CPC ........... G09G 3/006; G09G 2320/0233; G09G 2320/0626; G09G 2330/021; G09G 2330/08; H01L 22/22; H01L 22/32; H01L 25/167; H01L 33/62; H01L 25/0753; H01L 2933/0066; G01R 31/26
USPC .......................................................... 345/691
See application file for complete search history.

(56) References Cited

U.S. PATENT DOCUMENTS

| | | | |
|---|---|---|---|
| 9,007,350 B2 | 4/2015 | Burgin et al. | |
| 9,076,357 B2 | 7/2015 | Hussain et al. | |
| 9,125,272 B2 | 9/2015 | Huant | |
| 10,312,165 B1* | 6/2019 | Hsiang | ................ H01L 25/0753 |
| 10,600,823 B2 | 3/2020 | Hughes et al. | |
| 10,985,143 B2 | 4/2021 | Bower et al. | |
| 11,211,535 B2 | 12/2021 | Chen et al. | |
| 11,380,862 B2 | 7/2022 | Bibi et al. | |
| 2009/0134422 A1* | 5/2009 | Sah | ...................... H01L 25/0753 257/E33.001 |
| 2020/0193902 A1* | 6/2020 | Hsu | ...................... G09G 3/3406 |
| 2022/0223099 A1* | 7/2022 | Chao | ........................ G09G 3/32 |

* cited by examiner

*Primary Examiner* — Amare Mengistu
*Assistant Examiner* — Gloryvid Figueroa-Gibson
(74) *Attorney, Agent, or Firm* — Fletcher Yoder, P.C.

(57) ABSTRACT

A display system of a display includes multiple primary light emitting diodes and multiple secondary light emitting diodes. The multiple primary light emitting diodes may emit light, in which at least a first primary light emitting diode of the multiple primary light emitting diodes is shorted. Moreover, the multiple secondary light emitting diodes may emit light. At least a first secondary light emitting diode of the multiple secondary light emitting diodes is associated with the first primary light emitting diode, and the first secondary light emitting diode may emit light based at least in part on the first primary light emitting diode being shorted.

20 Claims, 15 Drawing Sheets

FIG. 18

TANDEM MICRO-LIGHT EMITTING DIODE REDUNDANCY ARCHITECTURE

CROSS-REFERENCE TO RELATED APPLICATIONS

This application claims priority to U.S. Provisional Application No. 63/247,201, filed Sep. 22, 2021, entitled "Tandem Micro-Light Emitting Diode Redundancy Architecture," the disclosure of which is incorporated herein by reference in its entirety for all purposes.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates generally to systems and devices for identifying, replacing, or mitigating light emitting diodes (LEDs) that are operating unexpectedly in a display panel.

In particular, a display may include one or more LEDs (e.g., primary and secondary LEDs). For example, a primary LED may be associated with a secondary LED, which functions as a backup LED to the primary LED if the primary LED operates unexpectedly. The primary LED and the secondary LED may be connected in series. A display circuitry of the display may test each of the primary LEDs by causing a driver to drive the primary LEDs with current and determine if the LED emits a particular brightness. The driver may subsequently drive the secondary LEDs by driving the secondary LEDs with current. In this manner, the display circuitry may identify which of the LEDs may be malfunctioning or not operating as expected (e.g., not emitting at the particular level of brightness) of each pair of the primary and secondary LEDs. To repair the display, a laser device may imprint metal (e.g., moly) to short the malfunctioning LEDs.

In some embodiments, the LEDs may be shorted (e.g., pre-shorted) prior to testing. An electroluminescence test may be performed to identify the malfunctioning LEDs of the display. After identifying the malfunctioning LEDs, a laser device may remove the short for the functioning LEDs (e.g., open the circuit) while leaving the malfunctioning LEDs shorted. In additional or alternative embodiments, the drivers and LEDs may connect to a global pad. Specifically, the global pad may short cathodes of the primary LEDs and the anodes of the secondary LEDs. The display circuitry may apply specified voltages (e.g., high or low voltages) to drive the primary and secondary LEDs to determine whether the LEDs are functioning as intended. A laser device or the like may short the malfunctioning LEDs. Furthermore, in some embodiments, the LEDs may connect to a series of switches that are configurable (e.g., via closing or opening the switch) to connect the LEDs to a current source and/or a decoder. The switches may be closed (e.g., turned on) to test each of the LEDs individually. After testing the LEDs, any malfunctioning LEDs may be shorted.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 18 is a block diagram illustrating a second repair process for sequentially identifying and repairing malfunctioning LEDs, according to embodiments of the present disclosure.

DETAILED DESCRIPTION

Figure 1:
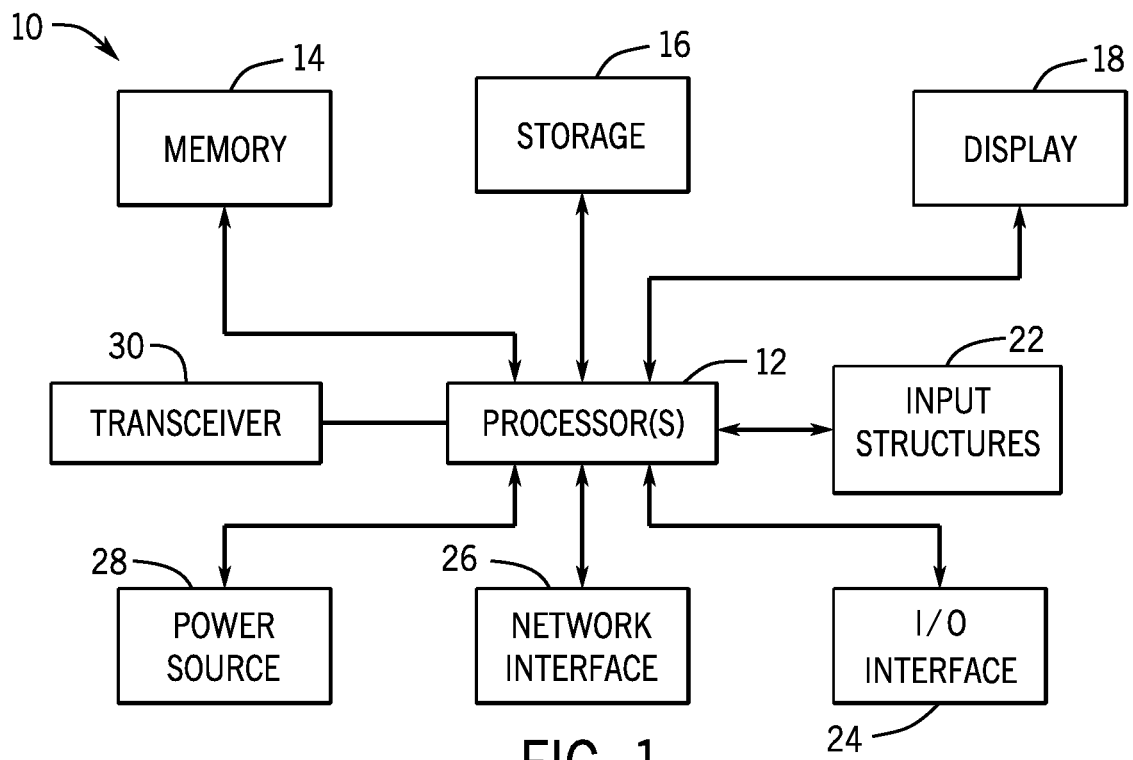
FIG. 1 is a block diagram of an electronic device, according to an embodiment of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment", "an embodiment", or "some embodiments" of the present disclosure are not intended to be interpreted as excluding the existence of additional embodiments that also incorporate the recited features. Use of the term "approximately" or "near" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Additionally, as used herein, a "malfunctioning light emitting diode" may refer to a light emitting diode (LED) that is not operating and/or functioning as expected. For example, a malfunctioning LED may not emit light at an intended brightness level. As another example, the malfunctioning LED may not turn on to emit any brightness or may continue to emit at a brightness level for longer or shorter than an intended time period. In yet another example, the malfunctioning LED may include an LED that is misplaced on the display (e.g., backplane of the display) and/or that is not properly bonded to the display. Also, as used herein, a "global pad" may refer to a pad of metal or the like material, that is connected to or a part of a display driver circuitry. The global pad may connect and enable interfacing between components, circuitry, input connections, and/or output connections throughout the entire display (e.g., global unidirectional or bidirectional communication). For example, the global pad may connect drivers, LEDs, power sources, and so forth. In some embodiments, the global pad may facilitate communication in a particular region or a particular pixel rather than globally. The global pad may be connected to the display circuitry via pins, bonding wires, and the like.

The present disclosure provides techniques for testing and/or repairing LEDs of a display. Some electronic displays may include multiple LEDs, for example, to drive the LEDs with less current to reduce power consumption of the display. In such display architectures, some of the multiple LEDs may function as redundant LEDs. As such, a malfunctioning LED may be replaced by one of the functioning multiple LEDs. For example, if a driver drives two LEDs and one no longer functions as intended, the driver may instead drive only the working LED. In this example, to illuminate at the same level as other LEDs on the display, the driver may drive the working LED with twice the amount of current.

As such, the systems and methods described herein disclose efficiently driving LEDs, identifying malfunctioning LEDs, repairing LEDs, or a combination thereof. In some embodiments, drivers may drive first LEDs and second LEDs of multiple rows of LEDs of a display. Display circuitry may test a first LED of each of the rows of LEDs by causing a driver to drive the first LEDs with current. The driver may subsequently drive a second LED of each of the rows of LEDs by driving the LEDs. In this manner, the display circuitry may identify which of the LEDs may be malfunctioning (e.g., not emitting light when driven). To repair the display, a laser device may imprint metal (e.g., moly) to short the malfunctioning LEDs.

In some embodiments, the LEDs may be shorted (e.g., pre-shorted) prior to testing. An electroluminescence test may be performed to identify malfunctioning LEDs of the display. After identifying the malfunctioning LEDs, a laser device may remove the short for the functioning LEDs (e.g., open up shorts) while the malfunctioning LEDs remain shorted. In additional or alternative embodiments, the drivers and LEDs may connect to a global pad. Specifically, the global pad may short cathodes of the first LEDs and the anodes of the second LEDs. The display circuitry may apply specified voltages (e.g., high or low voltages) to drive the first and second LEDs to determine whether the LEDs are functioning as intended. A laser device or the like may short the malfunctioning LEDs. Furthermore, in some embodiments, the LEDs may connect to a series of switches that are configurable (e.g., via closing or opening the switch) to connect the LEDs to current source and/or a decoder. The switches may be closed (e.g., turned on) to test each of the LEDs individually. After testing the LEDs, the malfunctioning LEDs may be shorted.

With the foregoing in mind, FIG. 1 illustrates an electronic device 10 according to an embodiment of the present disclosure may include, among other things, one or more processor(s) 12, memory 14, nonvolatile storage 16, a display 18, input structures 22, an input/output (I/O) interface 24, a network interface 26, a power source 28, and a transceiver 30. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
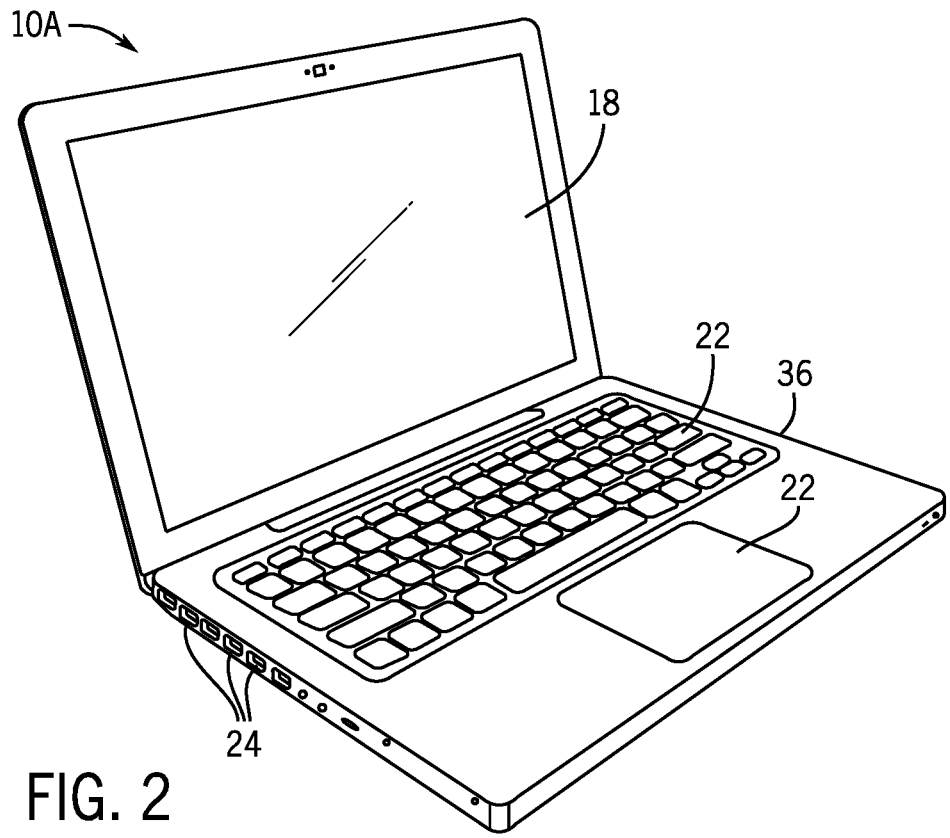
FIG. 2 is a perspective view of a notebook computer representing an embodiment of the electronic device of FIG. 1.
Figure 4:
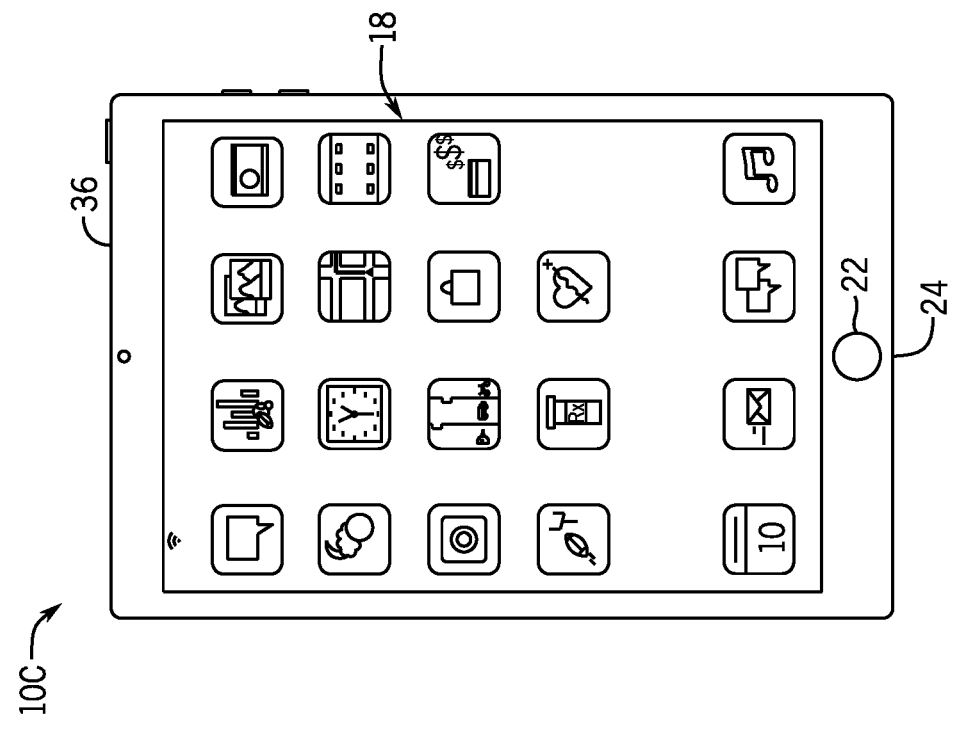
FIG. 4 is a front view of another handheld device representing another embodiment of the electronic device of FIG. 1.
Figure 3:
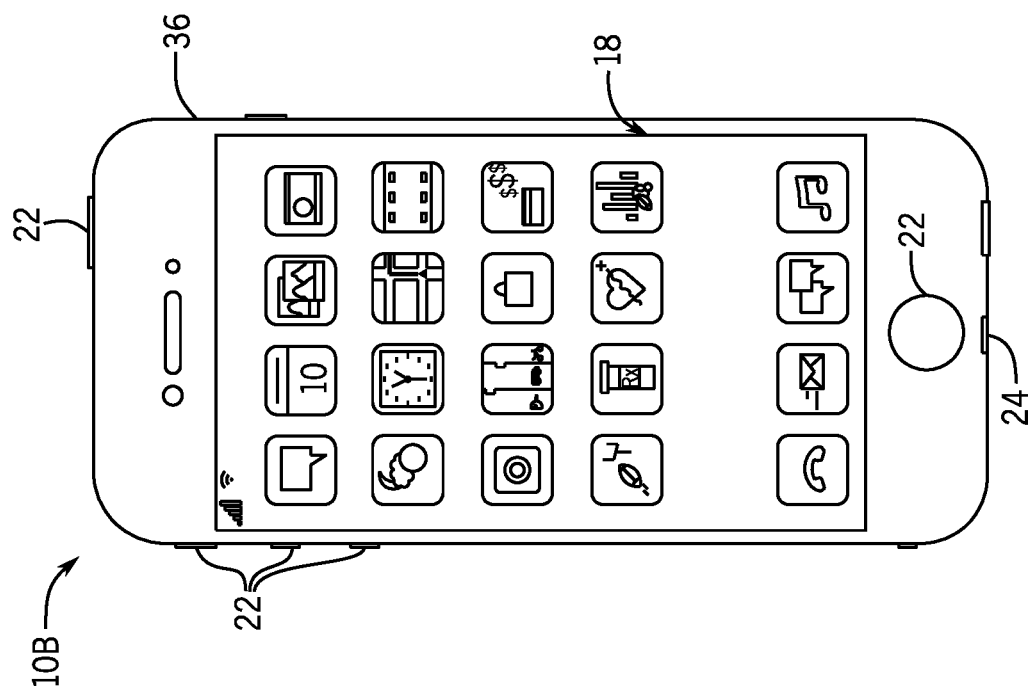
FIG. 3 is a front view of a handheld device representing another embodiment of the electronic device of FIG. 1.
Figure 5:
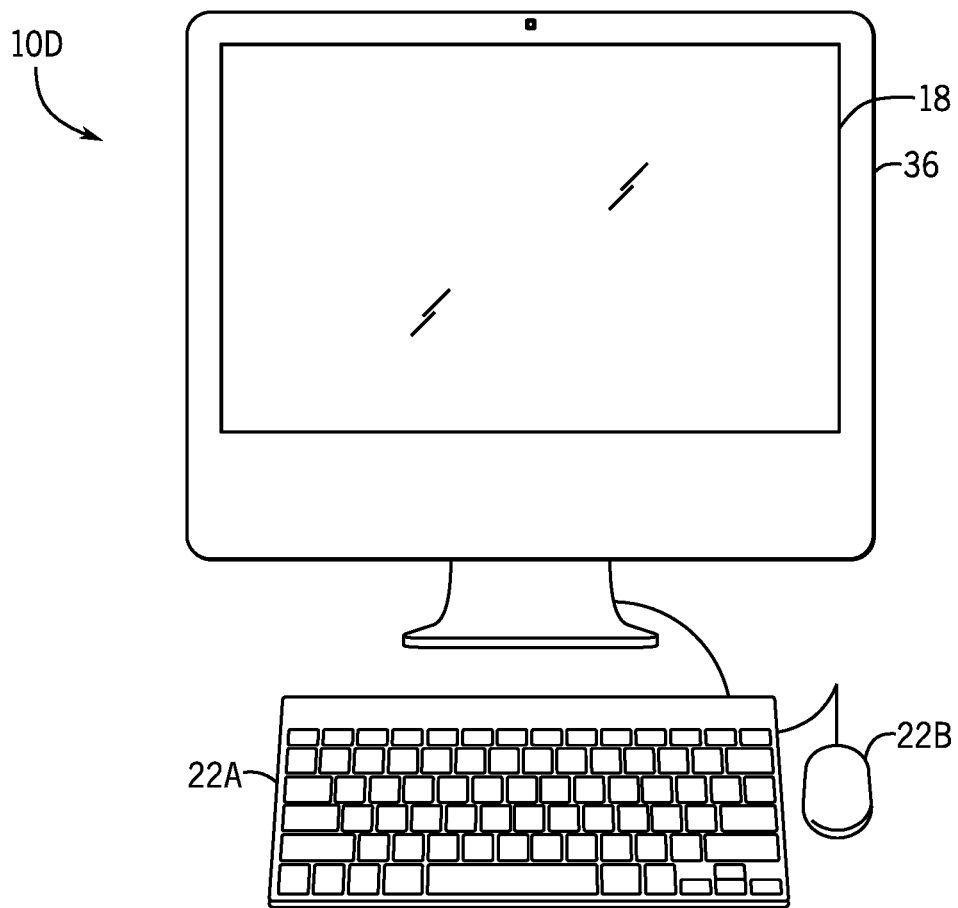
FIG. 5 is a front view of a desktop computer representing another embodiment of the electronic device of FIG. 1.
Figure 6:
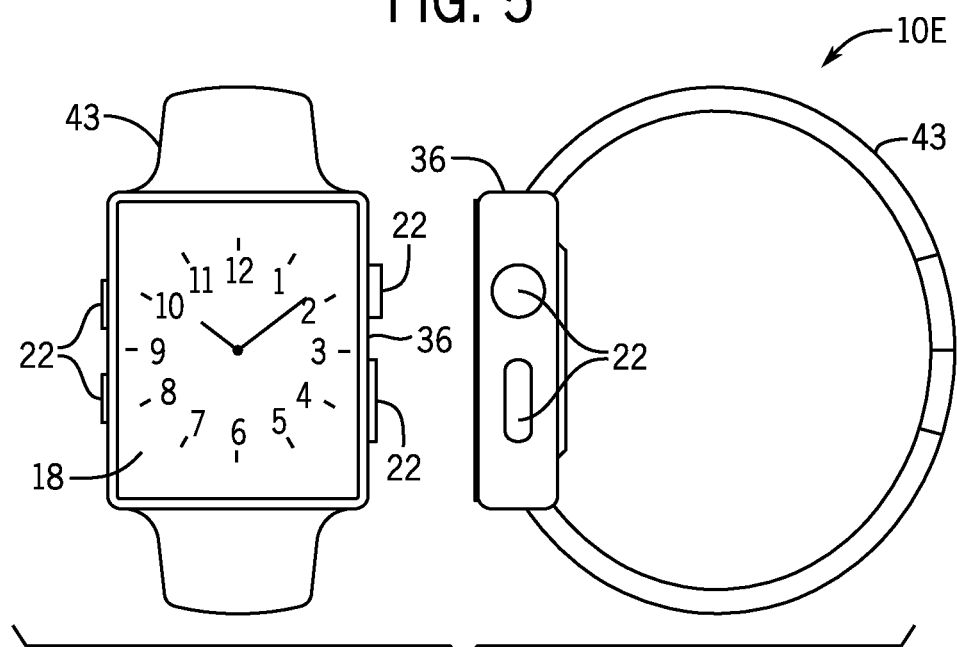
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, hardware, or any combination thereof. Furthermore, the processor(s) 12 and other related items in FIG. 1 may be a single contained processing module or may be incorporated wholly or partially within any of the other elements within the electronic device 10.

In the electronic device 10 of FIG. 1, the processor(s) 12 may be operably coupled with a memory 14 and a nonvolatile storage 16 to perform various algorithms. For example, the algorithms may include ones for current-voltage driving, current-voltage driving with active discharging of light emitting diodes (LEDs), current-voltage driving for LEDs having varying forward operating voltages, and so forth. Such algorithms or instructions executed by the processor(s) 12 may be stored in any suitable article of manufacture that includes one or more tangible, computer-readable media. The tangible, computer-readable media may include the memory 14 and/or the nonvolatile storage 16, individually or collectively, to store the algorithms or instructions. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more light-emitting diode (LED) displays, organic light-emitting diode (OLED) displays, active-matrix organic light-emitting diode (AMOLED) displays, or some combination of these and/or other display technologies. Often, one or more of the LEDs may not operate or function as expected (e.g., malfunctioning LEDs), for example, due to a drop in power or current levels required for the LED to turn on or emit an expected brightness. Briefly, and as will be described in detail herein, the display 18 and/or an external electronic device 10 may include circuitry with a global pad connected to microdrivers driving the LEDs to identify a portion of malfunctioning LEDs based on the connections and/or comparing measured electrical potentials for LEDs based on known electrical potentials of the LEDs. To repair the malfunctioning LEDs, the display 18 and/or the external electronic device 10 may include circuitry to cause another electronic device (e.g., a laser device) to short the malfunctioning LEDs (e.g., using laser-deposited metal or to open pre-shorts using laser cutting for pre-shorted LEDs that are properly functioning). In this manner, after the display 10 is turned on, circuitry of an electronic device 10 may determine malfunctioning LEDs. Moreover, the malfunctioning LEDs may be repaired (e.g., by using the redundant LEDs) to reduce or prevent perceivable unexpected displays on the display (e.g., no luminance on a region of the display 18).

The input structures 22 of the electronic device 10 may enable a user to interact with the electronic device 10 (e.g., pressing a button to increase or decrease a volume level). The I/O interface 24 may enable the electronic device 10 to interface with various other electronic devices, as may the network interface 26. The network interface 26 may include, for example, one or more interfaces for a personal area network (PAN), such as a BLUETOOTH® network, for a local area network (LAN) or wireless local area network (WLAN), such as an 802.11x WI-FI® network, and/or for a wide area network (WAN), such as a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network. In particular, the network interface 26 may include, for example, one or more interfaces for using a Release-15 cellular communication standard of the 5G specifications that include the millimeter wave (mmWave) frequency range (e.g., 24-300 GHz). The transceiver 30 of the electronic device 10, which includes the transmitter and the receiver, may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

In some embodiments, the electronic device 10 communicates over the aforementioned wireless networks (e.g., WI-FI®, WIMAX®, mobile WIMAX®, 4G, LTE®, 5G, and so forth) using the transceiver 30. The transceiver 30 may include circuitry useful in both wirelessly receiving the reception signals at the receiver and wirelessly transmitting the transmission signals from the transmitter (e.g., data signals, wireless data signals, wireless carrier signals, radio frequency signals). Indeed, in some embodiments, the transceiver 30 may include the transmitter and the receiver combined into a single unit, or, in other embodiments, the transceiver 30 may include the transmitter separate from the receiver. The transceiver 30 may transmit and receive radio frequency signals to support voice and/or data communication in wireless applications such as, for example, PAN networks (e.g., BLUETOOTH®), WLAN networks (e.g., 802.11x WI-FT®), WAN networks (e.g., 3G, 4G, 5G, NR, and LTE® and LTE-LAA cellular networks), WIMAX® networks, mobile WIMAX® networks, ADSL and VDSL networks, DVB-T® and DVB-H® networks, UWB networks, and so forth. As further illustrated, the electronic device 10 may include the power source 28. The power source 28 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may be generally portable (such as laptop, notebook, and tablet computers), or generally used in one place (such as desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. of Cupertino, California By way of example, the electronic device 10, taking the form of a notebook computer 10A, is illustrated in FIG. 2 in accordance with one embodiment of the present disclosure. The depicted notebook computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a graphical user interface (GUI) and/or applications running on computer 10A. For example, a keyboard and/or touchpad may allow a user to navigate a user interface and/or an application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPhone® available from Apple Inc. of Cupertino, California. The handheld device 10B may include an enclosure 36 to protect interior components from physical damage and/or to shield them from electromagnetic interference. The enclosure 36 may surround the display 18. The I/O interfaces 24 may open through the enclosure 36 and may include, for example, an I/O port for a hardwired connection for charging and/or content manipulation using a standard connector and protocol, such as the Lightning connector provided by Apple Inc. of Cupertino, California, a universal serial bus (USB), or other similar connector and protocol.

The input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone that may obtain a user's voice for various voice-related features, and a speaker that may enable audio playback and/or certain phone capabilities. The input structures 22 may also include a headphone input that may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, California.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. of Cupertino, California. It should be noted that the computer 10D may also represent a personal computer (PC) by another manufacturer. A similar enclosure 36 may be provided to protect and enclose internal components of the computer 10D, such as the display 18. In certain embodiments, a user of the computer 10D may interact with the computer 10D using various peripheral input structures 22, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple Inc. of Cupertino, California. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, LED display, OLED display, active-matrix organic light emitting diode (AMOLED) display, and so forth), as well as input structures 22, which may allow users to interact with a user interface of the wearable electronic device 10E.

Figure 7:
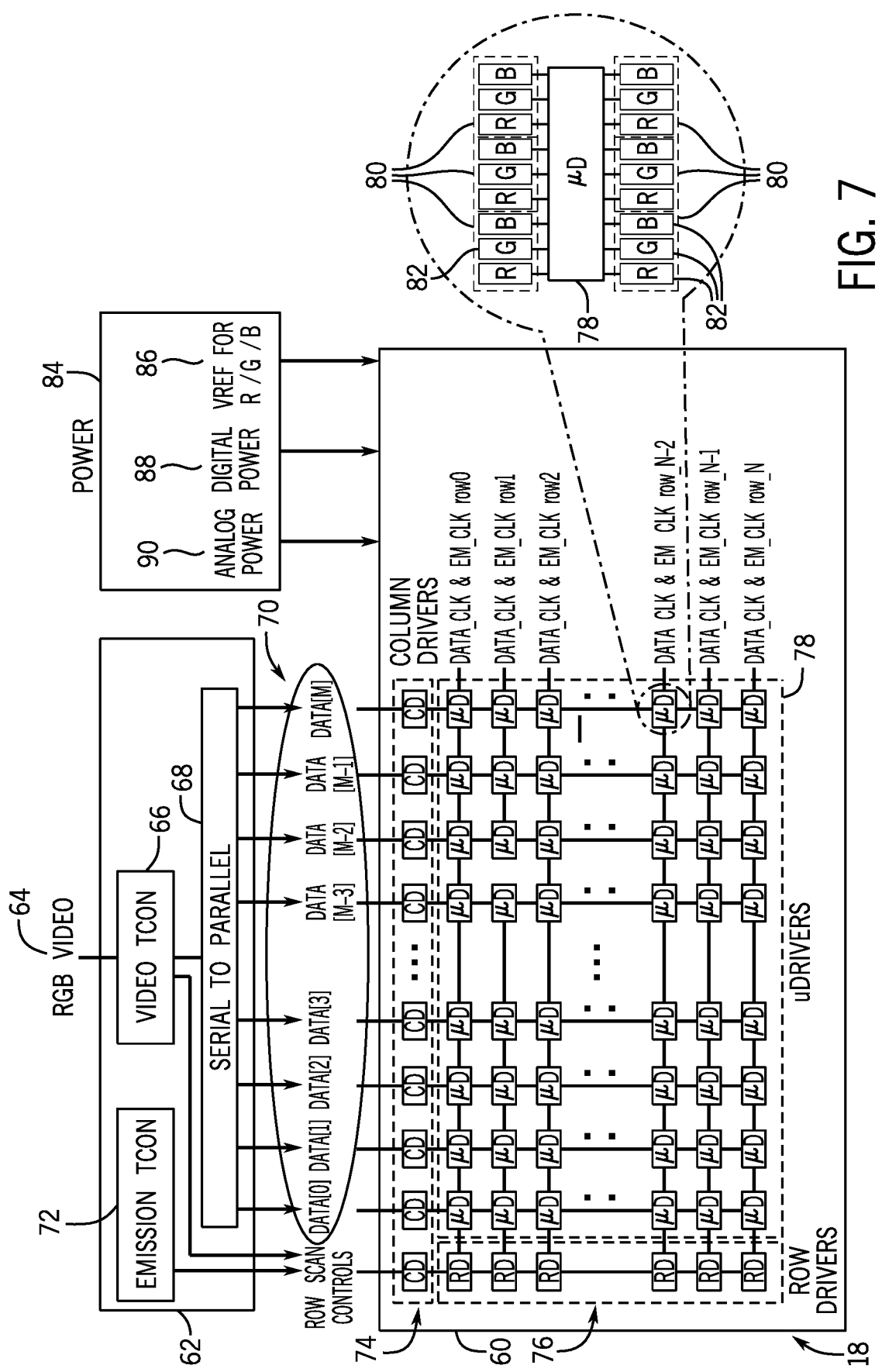
FIG. 7 is a block diagram of a μ-LED display that employs micro-drivers (μDs) to drive μ-LED sub-pixels with control signals from row drivers (RDs) and data signals from column drivers (CDs), according to embodiments of the present disclosure.

With the foregoing in mind, a block diagram of an architecture of a micro light emitting diode (μ-LED) display 18 appears in FIG. 7. Although the following descriptions describe μ-LEDs, the systems and methods described herein may apply to any LED, such as μ-LEDs, mini LEDs, and so forth. As shown, the display 18 may use a Red Green Blue (RGB) display panel 60 with pixels that include red, green, and blue μ-LEDs as subpixels. Support circuitry 62 may receive RGB-format video image data 64. It should be appreciated, however, that the display 18 may alternatively display other formats of image data, in which case the support circuitry 62 may receive image data of such different image format. In the support circuitry 62, a video timing controller (TCON) 66 may receive and use the image data 64 in a serial signal to determine a data clock signal (DATA_CLK) to control the provision of the image data 64 in the display 18. The video TCON 66 also passes the image data 64 to serial-to-parallel circuitry 68 that may deserialize the image data 64 signal into several parallel image data signals 70. That is, the serial-to-parallel circuitry 68 may collect the image data 64 into the particular data signals 70 that are passed on to specific columns among a total of M respective columns in the display panel 60. As such, the data 70 is labeled DATA[0], DATA[1], DATA[2], DATA[3] . . . DATA[M-3], DATA[M-2], DATA[M-1], and DATA[M]. The data 70 respectively contain image data corresponding to pixels in the first column, second column, third column, fourth column . . . fourth-to-last column, third-to-last column, second-to-last column, and last column, respectively. The data 70 may be collected into more or fewer columns depending on the number of columns that make up the display panel 60.

As noted above, the video TCON 66 may generate the data clock signal (DATA_CLK). An emission timing controller (TCON) 72 may generate an emission clock signal (EM_CLK). Collectively, these may be referred to as Row Scan Control signals. Circuitry on the display panel 60 may use the Row Scan Control signals to display the image data 70. The display panel 60 includes column drivers (CDs) 74, row drivers (RDs) 76, and micro-drivers (μDs) 78. Each μD 78 drives a number of pixels 80 having μ-LEDs as subpixels 82. Each pixel 80 includes at least one red μ-LED, at least one green μ-LED, and at least one blue μ-LED to represent the image data 64 in RGB format.

A power supply 84 may provide a reference voltage ($V_{ref}$) 86 to drive the μ-LEDs, a digital power signal 88, and an analog power signal 90. In some cases, the power supply 84 may provide more than one reference voltage ($V_{ref}$) 86 signal. Namely, subpixels 82 of different colors may be driven using different reference voltages. As such, the power supply 84 may provide more than one reference voltage ($V_{ref}$) 86. Additionally or alternatively, other circuitry on the display panel 60 may step the reference voltage ($V_{ref}$) 86 up or down to obtain different reference voltages to drive different colors of μ-LED.

To allow the μDs 78 to drive the μ-LED subpixels 82 of the pixels 80, the column drivers (CDs) 74 and the row drivers (RDs) 76 may operate in concert. Each column driver (CD) 74 may drive the respective image data 70 signal for that column in a digital form. Meanwhile, each RD 76 may provide the data clock signal (DATA_CLK) and the emission clock signal (EM_CLK) at an appropriate to activate the row of μDs 78 driven by the RD 76. A row of μDs 78 may be activated when the RD 76 that controls that row sends the data clock signal (DATA_CLK). This may cause the now-activated μDs 78 of that row to receive and store the digital image data 70 signal that is driven by the column drivers (CDs) 74. The μDs 78 of that row then may drive the pixels 80 based on the stored digital image data 70 signal based on the emission clock signal (EM_CLK). That is, the μDs 78 may drive the pixels 80 for a duration corresponding to the pulse width generated by the emission clock signal (EM_CLK).

Often, the display 18 includes multiples LEDs (e.g., μ-LEDs) to efficiently illuminate different regions of the display 18 at respective brightness levels. In some instances, a current source of the display 18 may include multiple transistors (e.g., mirror transistors) that are in line with signal paths to the LEDs. To efficiently drive the LEDs (e.g., reduce or prevent power loss), circuitry of the display 18 may drive the LEDs with the exact amount of power from the current source to turn on the LEDs. The circuitry may drive the LEDs with the same amount of current from the current source to provide a constant current and illuminate the LEDs consistently. In some embodiments, such as when the display 18 includes an LCD display, a backlight system of the display 18 may include the multiple LEDs 102. For example, the LCD display 18 may include a backlight of multiple LEDs to illuminate a display layer of the LCD display 18 to facilitate displaying an image.

Figure 8:
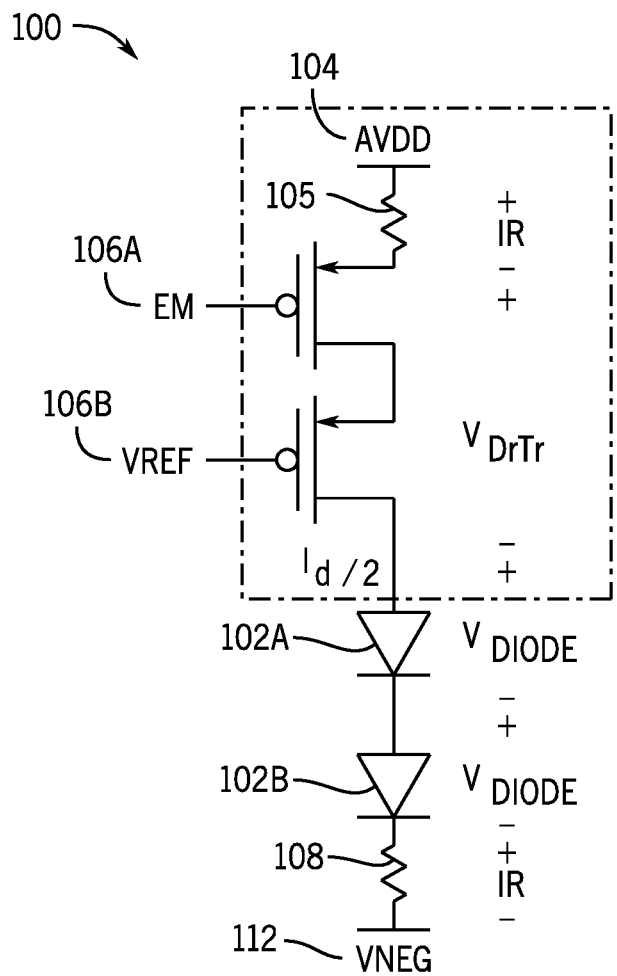
FIG. 8 a schematic diagram of a stacked light emitting diode circuit for reducing power consumption in a display panel, according to embodiments of the present disclosure.

However, these transistors may use some voltage, resulting in power overhead (e.g., power loss) for the LEDs. To reduce or minimize the amount of power overhead, the display 18 may include stacked LEDs. To illustrate in FIG. 8 is a schematic diagram of a stacked LED circuit 100 of a display panel 18. As shown, the stacked LED circuit 100 includes a first LED 102A and a second LED 102B. Although the systems and methods described herein describe two LEDs 102, which represents a particular embodiment, the systems and methods may include two or more LEDs 102 (e.g., two, four, twenty, one hundred, and so forth).

The stacked LED circuit 100 also includes an analog power supply 104 (AVDD) connected to a first resistor 105. A quotient of the AVDD 104 and the resistor 105 may provide a steady current source to a first transistor 106A and a second transistor 106B in a cascode formation. The AVDD 104, the first resistor 105, the transistors 106 may collectively function as a current source 107, as indicated by the dashed line box. The stacked LED circuit 100 also includes a second transistor 108 connected in series with the second LED 102B, and connected to a negative voltage 112 ($V_{Neg}$). The $V_{Neg}$ 112 may receive negative voltage form a power supply and may be used to turn on the LEDs 102.

The transistors 106 may be P-channel metal-oxide-semiconductor (PMOS) transistors. An input at a gate of the first transistor 106A may include an emission signal (EM) that may enable driving circuitry for LEDs 102 to drive the LEDs 102, and an output of the first transistor 106A may include a drain voltage ($V_{DrTr}$). An input at a gate of the second transistor 106B may include a reference voltage signal ($V_{Ref}$), and output from the second transistor 106B may include current for the LEDs 102 (e.g., diode current). As previously discussed, the $V_{Ref}$ may refer to a reference voltage to drive the LEDs 102.

The first LED 102A and the second LED 102B are connected in series and since they illuminate at the same time, the brightness for the pixel may be doubled. As such, the current source 107 may drive the LEDs 102 with half the amount of current to reduce the brightness back to the intended level of brightness. By reducing the driving current to half, the stacked LED circuit 100 may reduce power consumption. The power overhead resulting from the transistors 106 using some power intended for the LEDs 102, may also result in a voltage drop due across a resistance (e.g., an IR drop) as a product of current (I) passing through resistance (R), such as through the first resistor 105 and the second resistor 108. By reducing the driving current to half, the stacked LED circuit 100 may also reduce the IR drop across the first resistor 105 and the second resistor 108. By way of example, the stacked LED circuit 100 may reduce power consumption by at least 25% in comparison to a cascode current source with a single LED 102 or the LEDs 102 not connected in series (e.g., in parallel).

In some cases, one or more LEDs 102 may malfunction, such that they are not operating and/or functioning as expected. For example, a malfunctioning LED 102 may not emit at an intended brightness level. As another example, the LED 102 may not turn on to emit any brightness or may continue to emit at a brightness level for longer or shorter than an intended time period. Since the stacked LED circuit 102 provided two LEDs 102 driven simultaneously by a μD 78, one of the LEDs 102 may function as a redundant LED 102. That is, if one of the LEDs 102 is malfunctioning, circuitry of the display 18 may switch to using a functioning LED 102 instead, such as the second LED 102B, for emitting light. As will be described herein, FIGS. 9-12 illustrate circuits and/or methods for identifying a malfunctioning LED 102 and/or replacing the malfunctioning LED 102 (e.g., such as by driving a different, functioning LED 102).

Figure 9:
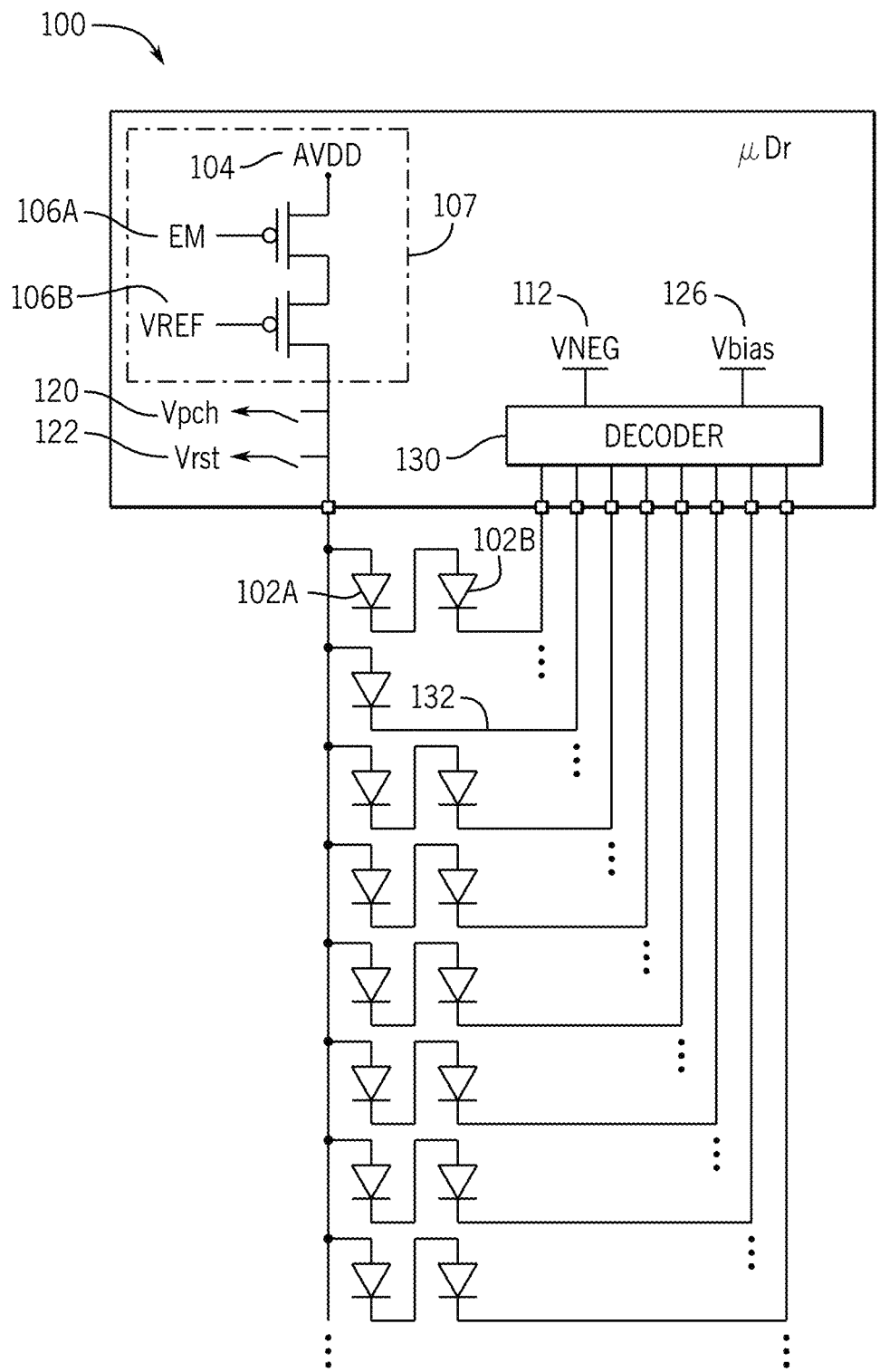
FIG. 9 is a schematic diagram of a shorting repair applied to the stacked light emitting diode circuit of FIG. 8, according to embodiments of the present disclosure.

To illustrate, FIG. 9 is a schematic diagram of a shorting repair applied to the stacked LED circuit 100 of FIG. 8. As shown, the stacked LED circuit 100 may include the current source 107 which may include components (e.g., the AVDD 104 and the transistors 106) and function as described with respect to FIG. 8. The stacked LED circuit 100 also includes a pre-charge voltage switch 120 ($V_{pch}$) and a reset voltage switch 122 ($V_{rst}$). The circuitry of the display 18 may pre-charge capacitors of the LEDs 102 for driving the LEDs 102 using the $V_{pch}$ 120 (e.g., when the switch is closed or on) prior to driving the LEDs 102 using the current source 107. The circuitry may also reset the LEDs 102 using the $V_{rst}$ 122 (e.g., when the switch is closed or on). The stacked LED circuit 100 also includes the $V_{Neg}$ 112 and a bias voltage 126 ($V_{Bias}$) that are coupled to a decoder 130. The decoder 130 may select one or more LEDs 102 for driving. For example, the decoder 130 may select a first row of LEDs 102 that include the first LED 102A and the second LED 102B by connecting the LEDs 102 to the $V_{Neg}$ 112 while connected other components (e.g., not to be driven) to the $V_{Bias}$ 126. Although the depicted embodiment shows eight rows of the first LED 102 and the second LED 102, the stacked LED circuit 100 may include one or more rows of LEDs 102, in which each of the rows have two or more LEDs 102 connected in series (e.g., the first LED 102A, the second LED 102B, a third LED 102C, and so forth).

To identify whether the first LEDs 102A of each of the rows is working (e.g., test the LEDs 102), circuitry of the display 18 may use the decoder 130 to connect the first LEDs 102A to the $V_{Neg}$ 112 and the second LEDs 102B of each row to $V_{Bias}$ 126. The circuitry of the display 18 may cause the μD 78 to drive respective LEDs 102 to emit light using the current source 107. The LEDs 102 connected to the $V_{Neg}$ 112 may emit light while the LEDs 102 connected to the $V_{Bias}$ 126 may not emit light. After testing the first LEDs 102 of each of the rows, the circuitry of the display 18 may identify whether the second LEDs 102B of each of the rows is working. That is, the circuitry may use the decoder 130 to connect the second LEDs 102B to the $V_{Neg}$ 112 and the first LEDs 102A of each row to $V_{Bias}$ 126, and may cause the μD 78 to drive respective LEDs 102 to emit light using the current source 107. During each of these tests, the LEDs 102 connected to the $V_{Neg}$ 112 may emit light while the LEDs 102 connected to the $V_{Bias}$ 126 may not emit light.

However, one or more of the LEDs 102 that are expected to emit light and/or emit at a particular level but do not may be malfunctioning (e.g., not operating as expected). For example, the second LED 102B of the second row of LEDs 102 is malfunctioning, as indicated by the X over the second LED 102B. After determining that the LED 102 is malfunctioning, the second LED 102B may be shorted so that only the first LED 102A is used to emit the brightness for the pixel. Additionally, the circuitry may drive the first LED 102A with twice the current so that the first LED 102A provides the same level of brightness.

In particular, a laser device or the like may short the first LED 102A and the second LED 102B via a metal imprint 132. The laser device may use laser to imprint the metal to short the LEDs 102. In some embodiments, the metal may include moly or a similar material. The cathode of the first LED 102 may have electrodes exposed that may be shorted using laser, for example, to short the malfunctioning second LED 102B (which is in series with the first LED 102A). In general, the cathode of each of the LEDs 102 may have electrodes exposed so that the LEDs 102 may be shorted if they are determined to be malfunctioning LEDs 102.

Figure 10:
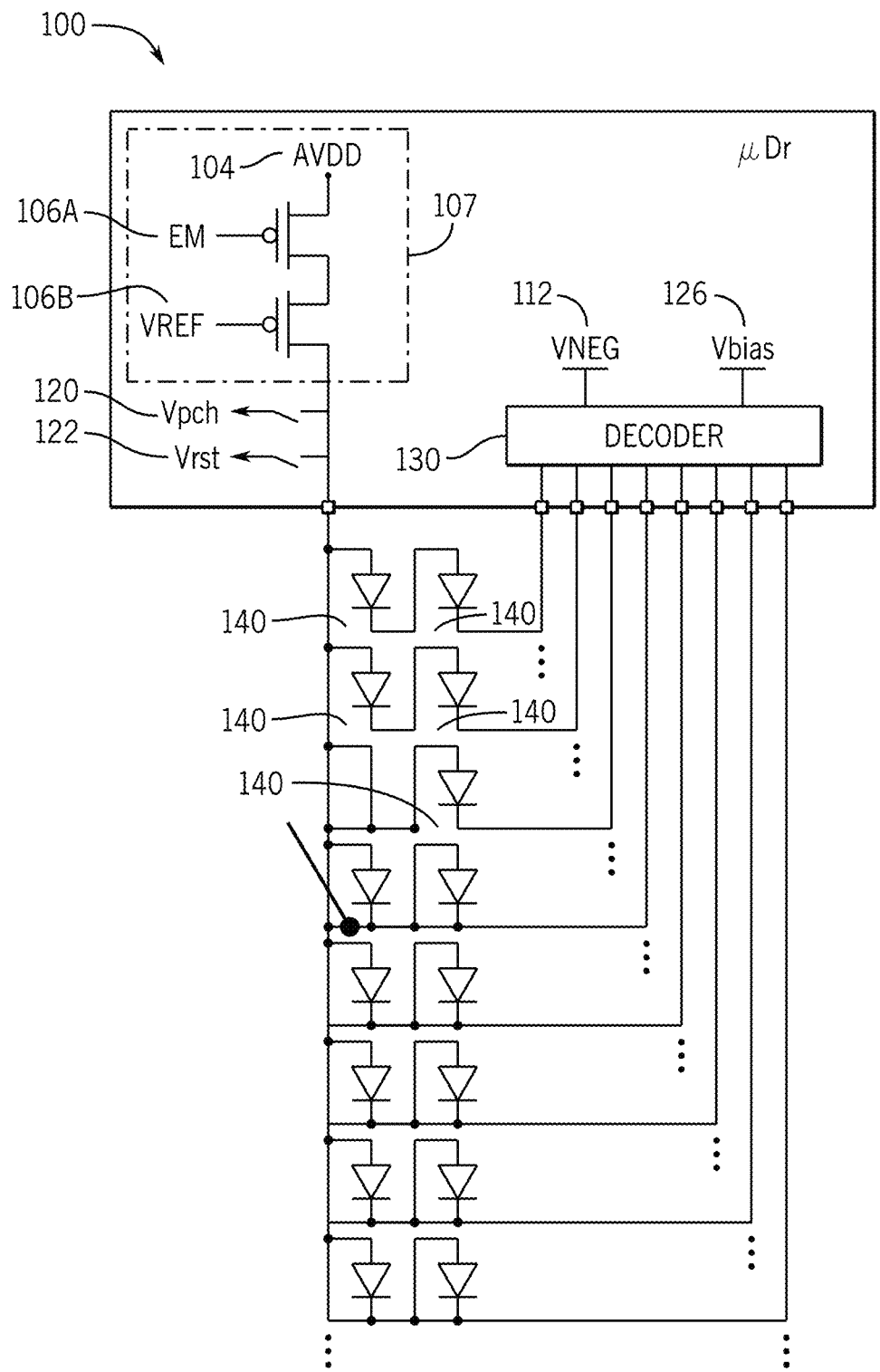
FIG. 10 is a schematic diagram of a laser-cutting repair applied to the stacked light emitting diode circuit of FIG. 8, according to embodiments of the present disclosure.

Additionally or alternatively, the stacked LED circuit 100 may include LEDs 102 that are already shorted (e.g., pre-shorted). The shorts may include metal, such as moly, indium tin oxide (ITO), or the like. To illustrate, FIG. 10 is a schematic diagram of a laser-cutting repair applied to the stacked LED circuit 100 of FIG. 8. The stacked LED circuit 100 may include the current source 107 which may include components (e.g., the AVDD 104 and the transistors 106) and function as described with respect to FIG. 8. Additionally, the circuitry of the display 18 may pre-charge capacitors of the LEDs 102 using the pre-charge voltage switch 120 and may reset the LEDs 102 using the reset voltage switch 122, as described with respect to FIG. 9. Furthermore, the decoder 130, the VNeg 112, and VBias 126 may operate as described with respect to FIG. 9. For example, the decoder 130 may select one or more LEDs 102 for driving by connecting the LEDs to the VNeg 112 and connecting the unselected LEDs 102 to VBias 126.

To determine whether the LEDs 102 are functioning as expected, an electroluminescence test may be performed. The test may involve a device or system of devices (e.g., a probe station) that provides ultraviolet (UV) light on the display 18. The device may terminate the light and upon terminating the light, the device may capture an image of the display. The test may cause the LEDs 102 to glow is the LEDs 102 are functioning as expected. If however, the LEDs 102 are not glowing, the LEDs 102 may be determined to be malfunctioning LEDs 102.

If each of the LEDs 102 are properly functioning, a laser device may open the shorts as opened shorts 140 for the functioning LEDs 102 using a laser. If one or more of the LEDs 102 are malfunctioning, the laser device may open the shorts for the functioning LEDs 102 while leaving the malfunctioning LEDs 102 shorted. That is, the laser may remove the metal for the pre-shorted LEDs 102 that are functioning. In the current embodiment, only the first LED 102A of the third row is a malfunctioning LED 102, as indicated by the X over the first LED 102A. Thus, the laser device may open the short for each of the LEDs 102 that are functioning. In some embodiments, the laser device may open the short for each of the LEDs 102 in the same column and/or in the rows before the malfunctioning LED 102. By way of example, for the malfunctioning first LED 102A of the third row, the laser device may open the shorts for the first LEDs 102A of the first and second rows.

Figure 11:
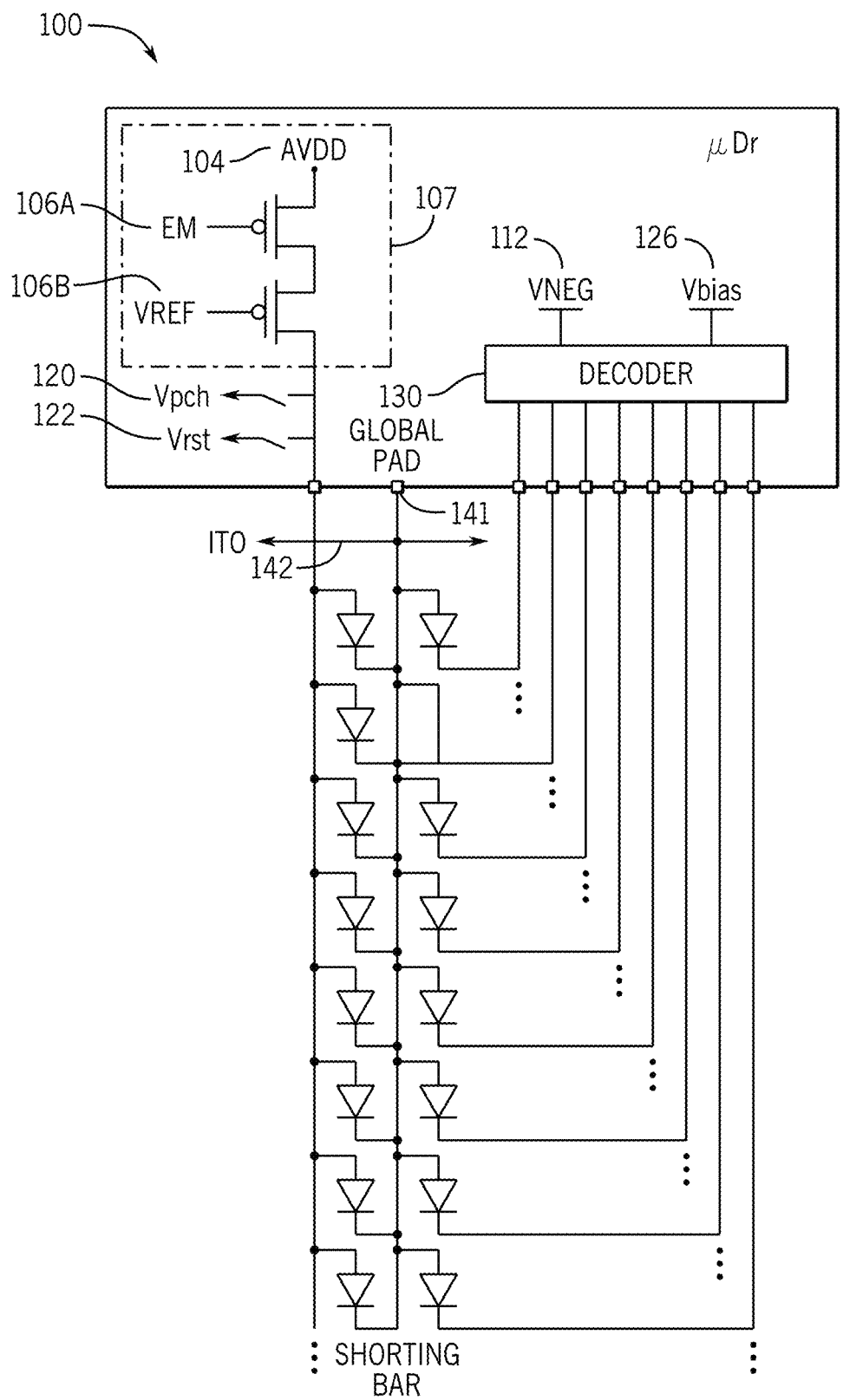
FIG. 11 is a schematic diagram of a global pad shorting repair applied to the stacked light emitting diode circuit of FIG. 8, according to embodiments of the present disclosure.

FIG. 11 is a schematic diagram of a global pad shorting repair applied to the stacked LED circuit 100 of FIG. 8. The stacked LED circuit 100 may include the current source 107 which may function as described with respect to FIG. 8. Additionally, the circuitry of the display 18 may pre-charge capacitors of the LEDs 102 using the pre-charge voltage switch 120 and may reset the LEDs 102 using the reset voltage switch 122, as described with respect to FIG. 9. Furthermore, the decoder 130, the $V_{Neg}$ 112, and $V_{Bias}$ 126 may operate as described with respect to FIG. 9. For example, the decoder 130 may select one or more LEDs 102 for driving by connecting the LEDs 102 to the $V_{Neg}$ 112 and connecting the unselected LEDs 102 to $V_{Bias}$ 126.

Generally, the stacked LED circuit 100 with a global pad 141 may be repaired similarly to the shorting repair discussed with respect to FIG. 9. However, circuitry of the display 18 may efficiently determine whether the LEDs 102 are operating as expected using the global pad 141. In particular, the global pad 141 may be shorted (e.g., connected) to each of the µDs 78 driving the LEDs 102 of the display 18, such as the first LEDs 102A and the second LEDs 102B of each of the rows. In particular, a shorting bar 142 made of ITO (e.g., conducting oxide or the like material) may short the global pad 141 to the µDs 78 and the LEDs 102.

In contrast to the testing for the stacked LED circuit 100 of FIG. 9, in which a first test is performed for the first LEDs 102A (e.g., emit light from the first LEDs 102A of each of the rows) and then a subsequent test is performed for the second LEDs 102 (e.g., emit light from the first LEDs 102B of each of the rows), the stacked LED circuit 100 here may identify a malfunctioning LED 102 in one step. In particular, the global pad 141 is shorted to the cathode of each of the first LEDs 102A and to each of the anodes of the second LEDs 102B. The circuitry of the display 18 may drive the global pad 141 with a high voltage. Each of the second LEDs 102B (e.g., on the right side of global pad 141) should emit light if they are not malfunctioning. The circuitry of the display 18 may simultaneously drive the global pad 141 with a low voltage while at the same time enable the current source 107 (e.g., driving circuit) to provide the current, and each of the first LEDs 102A (e.g., on the left side of the global pad 141) should emit light if they are not malfunctioning. In this manner, the circuitry may efficiently identify which particular LEDs 102 of each of the rows are properly functioning or malfunctioning.

Here, the second LED 102B of the second row is identified as a malfunctioning LED 102, as indicated by the X over the LED 102. The other LEDs 102 that remain functioning, may be selectively etched using a dynamic mask step. That is, the short at the functioning LEDs 102 may be removed (e.g., "un-shorting" or "opening" the circuit) by selectively etching while the selected malfunctioning second LED 102B may remain shorted with the ITO material. In some embodiments, to repair the display 18, the short at the malfunctioning second LED 102B may also be removed, and the opened shorts of each of the LEDs 102 may each be replaced with a new ITO short. As such, when circuitry of the display drives the first LED 102A and the second LED 102B of the third row, the current may go to the first LED 102A but bypass the second LED 102B.

Figure 12:
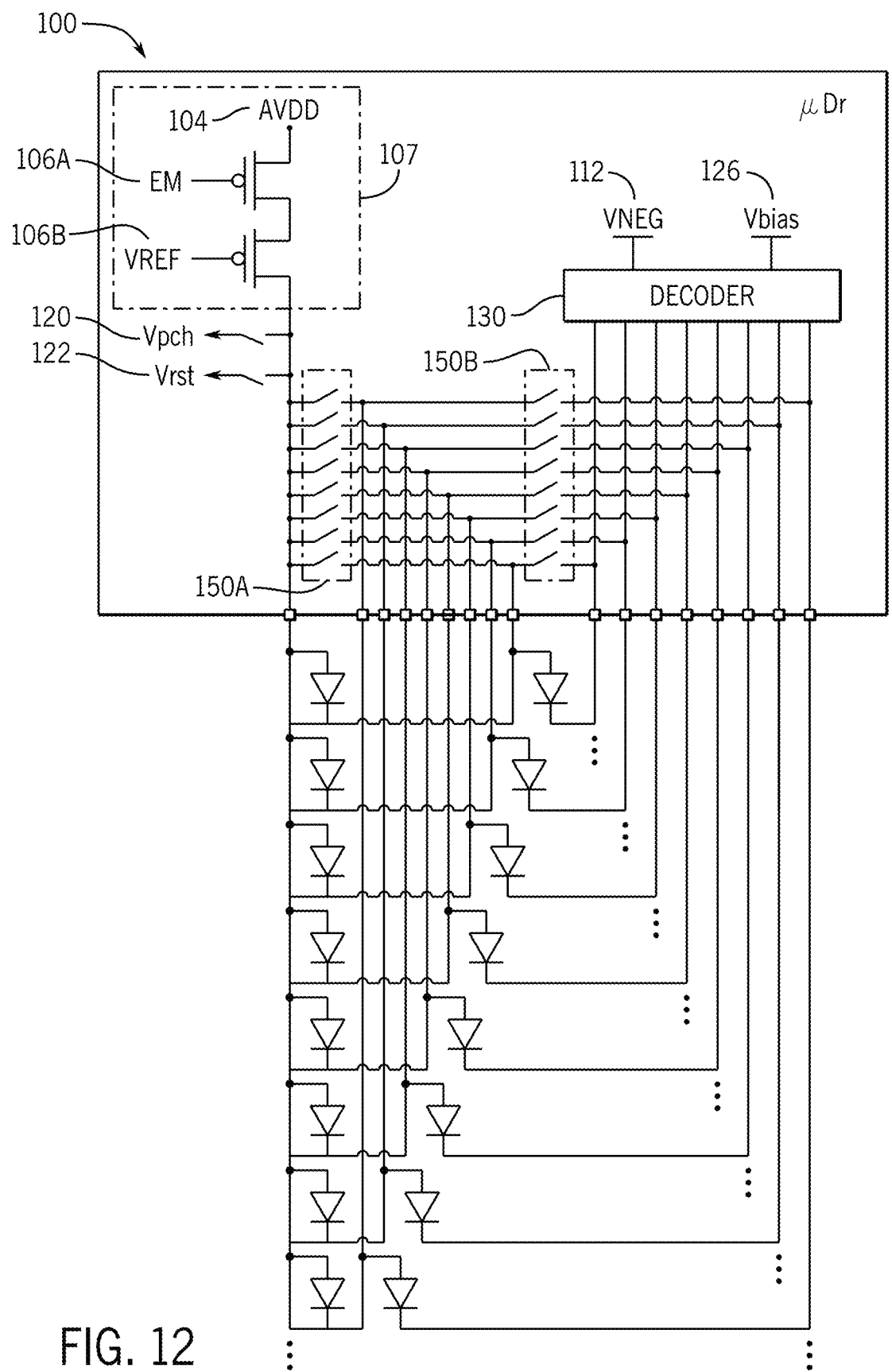
FIG. 12 is a schematic diagram of an electrical shunting repair applied to the stacked light emitting diode circuit of FIG. 8, according to embodiments of the present disclosure.

FIG. 12 is a schematic diagram of an electrical shunting repair applied to the stacked LED circuit 100 of FIG. 8. The stacked LED circuit 100 in the depicted embodiment may include the current source 107 which may function as described with respect to FIG. 8. Additionally, the circuitry of the display 18 may pre-charge capacitors of the LEDs 102 using the pre-charge voltage switch 120 and may reset the LEDs 102 using the reset voltage switch 122, as described with respect to FIG. 9. Furthermore, the decoder 130, the $V_{Neg}$ 112, and $V_{Bias}$ 126 may operate as described with respect to FIG. 9. For example, the decoder 130 may select one or more LEDs 102 for driving by connecting the LEDs 102 to the $V_{Neg}$ 112 and connecting the unselected LEDs 102 to $V_{Bias}$ 126.

In the depicted embodiment, the stacked LED circuit 100 may also include a series of switches 150. A first set of switches 150A connect to the first LEDs 102A of each of the rows of LEDs 102 while a second set of switches 150B connect to the second LEDs 102B of each of the rows of the LEDs 102. In particular, the switches connect to the μDs 78 driving the respective LEDs 102. When the switches 150 are closed (e.g., turned on) to select a particular LED 102, the switches may shunt or direct current to the selected LED 102. Thus, circuitry of the display 18 may individually test each of the LEDs 102 one at a time by selectively closing a switch 150 for driving the selected LED 102.

By way of example, to drive the first LED 102A of the first row, a switch connected to this LED 102 (as indicated by the solid line box) may be closed to complete the path to the decoder 130. However, the rest of the switches 150 may remain open, and thus, the first LED 102A of the first row may be tested individually. A second switch connecting the first LED 102A of the first row to the decoder 130 may be closed (as indicated by the dot line box). The circuitry of the display 18 may turn on the current source 107 and the current may be directed through the completed path from the μD 78 to the first LED 102A of the first row since the other paths are open via the open switches 150, and then to the decoder 130. Subsequently, the rest of the LEDs 102A may be tested individually by completing the paths from the μD 78 to the tested LED 102. In this manner, the stacked LED circuit 100 may provide an architecture for efficiently testing and/or repairing a malfunctioning LED 102 (e.g., with a redundant second LED 102B). To summarize the process for testing and/or repairing, FIGS. 13-16 describe the processes for testing and repairing LEDs 102 of the stacked LED circuit 100 of FIGS. 9-12.

Figure 13:
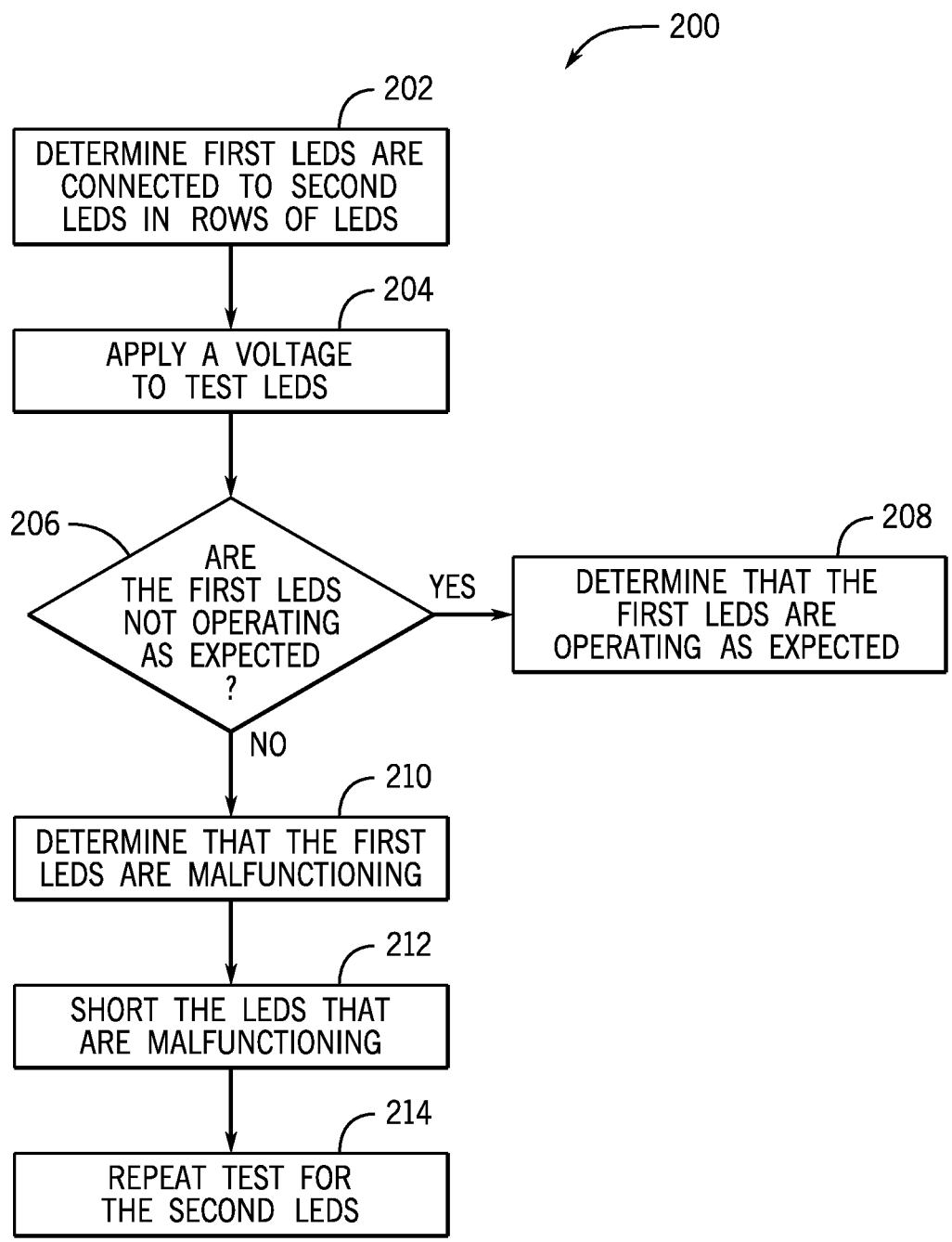
FIG. 13 is a process flow diagram of the shorting repair of FIG. 9, according to embodiments of the present disclosure.

FIG. 13 is a process flow diagram of a method 200 for the shorting repair of FIG. 9. Any suitable device that may control the electronic device 10 and/or the circuitry of the display 18, such as the processor 12 (e.g., one or more processors), may perform the method 200. The processor 12 may also perform the methods described with respect to other processes described herein, such as the processes of FIGS. 14-16. The method 200 may be implemented by executing instructions stored in a tangible, non-transitory, computer-readable medium, such as the memory 14 (e.g., one or more memory devices), using the processors 12. The processor 12 of the electronic device 10 may execute instructions to perform the method 200 that are stored in the memory 14 and carried out by the processor 12. In some embodiments, display driving circuitry may perform method 200 and the methods described with respect to other processes described herein. For example, the display driving circuitry may perform the methods described in FIGS. 14-16. Additionally or alternatively, the methods may be carried out using instructions (e.g., software), calibration circuitry (e.g., a computer controlling factory assets such as robotics), and so forth. Moreover, some of the methods related to a laser may be performed using a laser device in a factory setting. While the method 200 is described using steps in a specific sequence, it should be understood that the present disclosure contemplates that the described steps may be performed in different sequences than the sequence illustrated, and certain described steps may be skipped or not performed altogether.

At process block 202, one or more first LEDs 102A (e.g., primary LEDs) are connected to one or more second LEDs 102B (e.g., secondary LEDs or redundant LEDs) in one or more rows of LEDs 102 of a display 18 may be determined. In particular, each of the first LEDs 102A may be connected in series with a second LED 102B. If any of the LEDs 102 in a row are malfunctioning, the malfunctioning LED 102 may be repaired or bypassed for emitting light for the pixel. Briefly, and as discussed in detail with respect to FIG. 9, the first LEDs 102A may be tested first by connected the first LEDs 102A to a negative voltage while connecting the LEDs 102 not to be tested (e.g., LED 102B) may be connected to a bias voltage. The first LEDs 102A and the second LEDs 102B may be tested separately to precisely determine which LED 102 in a row may be malfunctioning since the LEDs 102 are connected in series, and as such, do not provide an indication of the individual LED in the row that is malfunctioning.

At process block 204, a voltage may be applied to the first LEDs 102A. After the first LEDs 102A are connected to the negative voltage, μDs 78 may drive the respective LEDs 102 with a voltage to turn on the LEDs 102. The LEDs connected to the negative voltage, such as the first LEDs 102A, should emit brightness. At decision block 206, whether the first LEDs 102A are operating as expected may be determined. Specifically, LEDs 102 that emit light at the intended brightness level and/or for the intended duration may be properly functioning. That is, if the LEDs 102 are functioning as expected, whether the first LEDs 102 are operating as expected (e.g., properly functioning LEDs 102) may be determined at process block 208.

If the one or more of the first LEDs 102A are not operating as expected, the one or more first LEDs 102A may be determined as malfunctioning at process block 210. Since first LEDs 102A may not be operating as expected, a laser device may short the one or more first LEDs 102A that are malfunctioning (e.g., the processor 12 of the electronic device 10 causes a laser device to perform shorting). Specifically, and as previously described, the laser device may use a laser to imprint metal (e.g., moly) to short the malfunctioning first LEDs 102, at process block 212. In some embodiments, the malfunctioning LEDs 102 may be electrically shorted via switches, such as by electrically turning off the switches (e.g., open the switches for the malfunctioning LEDs 102). Data indicating the LEDs 102 as functioning and/or malfunctioning may be stored in memory of the electronic device 10.

The cathode of the malfunctioning first LED 102 may have electrodes exposed that may be shorted using a metal solution (e.g., moly) that can be imprinted using a laser, thereby shorting the malfunctioning LED 102A. At process block 214, the test and/or repair using the laser may be performed for the second LEDs 102B of each of the rows.

Figure 14:
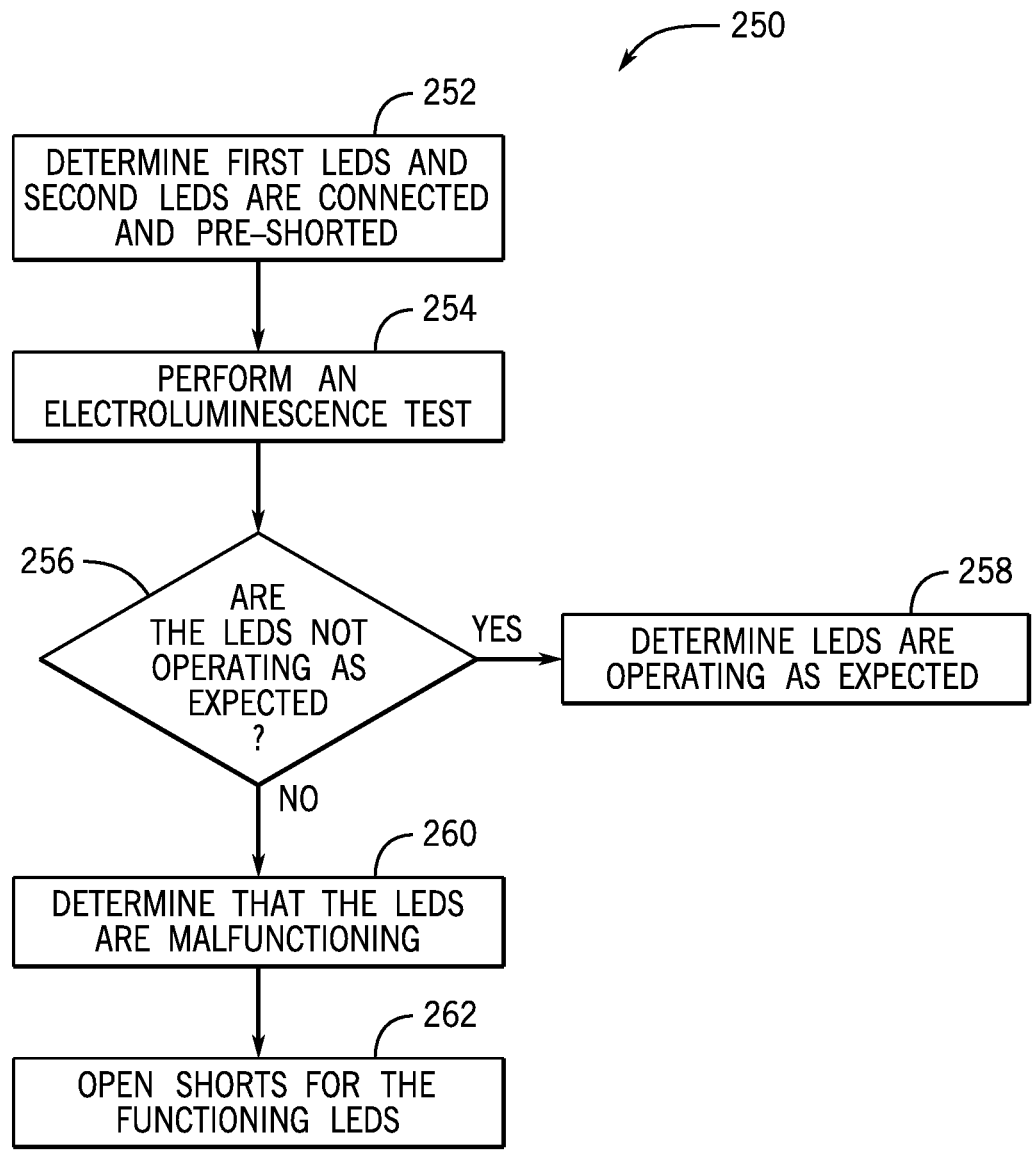
FIG. 14 is a process flow diagram of the laser-cutting of FIG. 10, according to embodiments of the present disclosure.

FIG. 14 is a process flow diagram of a method 150 for laser-cutting of FIG. 10. In this embodiment, the test may be performed simultaneously for each of the LEDs 102 (e.g., rather than individually testing each LED 102 and/or a set of LEDs 102). At process block 252, one or more first LEDs 102A being connected to one or more second LEDs 102B in one or more rows of LEDs 102 of a display 18 may be determined, as discussed with respect to FIG. 13. All of the LEDs 102 being shorted to each other and/or the μDs 78 may be determined. That is, the first and second LEDs 102 are pre-shorted. At process block 254, an electroluminescence test may be performed. As previously mentioned, the test may involve providing UV light on the display 18. Upon terminating the light, the electroluminescence device may capture an image of the display.

At decision block 256, whether the LEDs 102 are operating as expected may be determined. That is, whether the LEDs 102 are operating as expected, such as emitting the correct level of brightness for the LEDs 102 (e.g., glowing LEDs), may be determined. In particular, if the LEDs 102 are emitting light as expected, the LEDs 102 may be determined as operating as expected at process block 258.

However, if the one or more of the LEDs 102 are not emitting light as expected, the LEDs 102 may be determined as malfunctioning LEDs 102 at process block 260. Since the LEDs 102 are not emitting light as expected and thus, malfunctioning, a laser device may open or remove shorts for the LEDs 102, at process block 262. That is, the laser may remove the metal for the pre-shorted LEDs 102 that are functioning.

Figure 15:
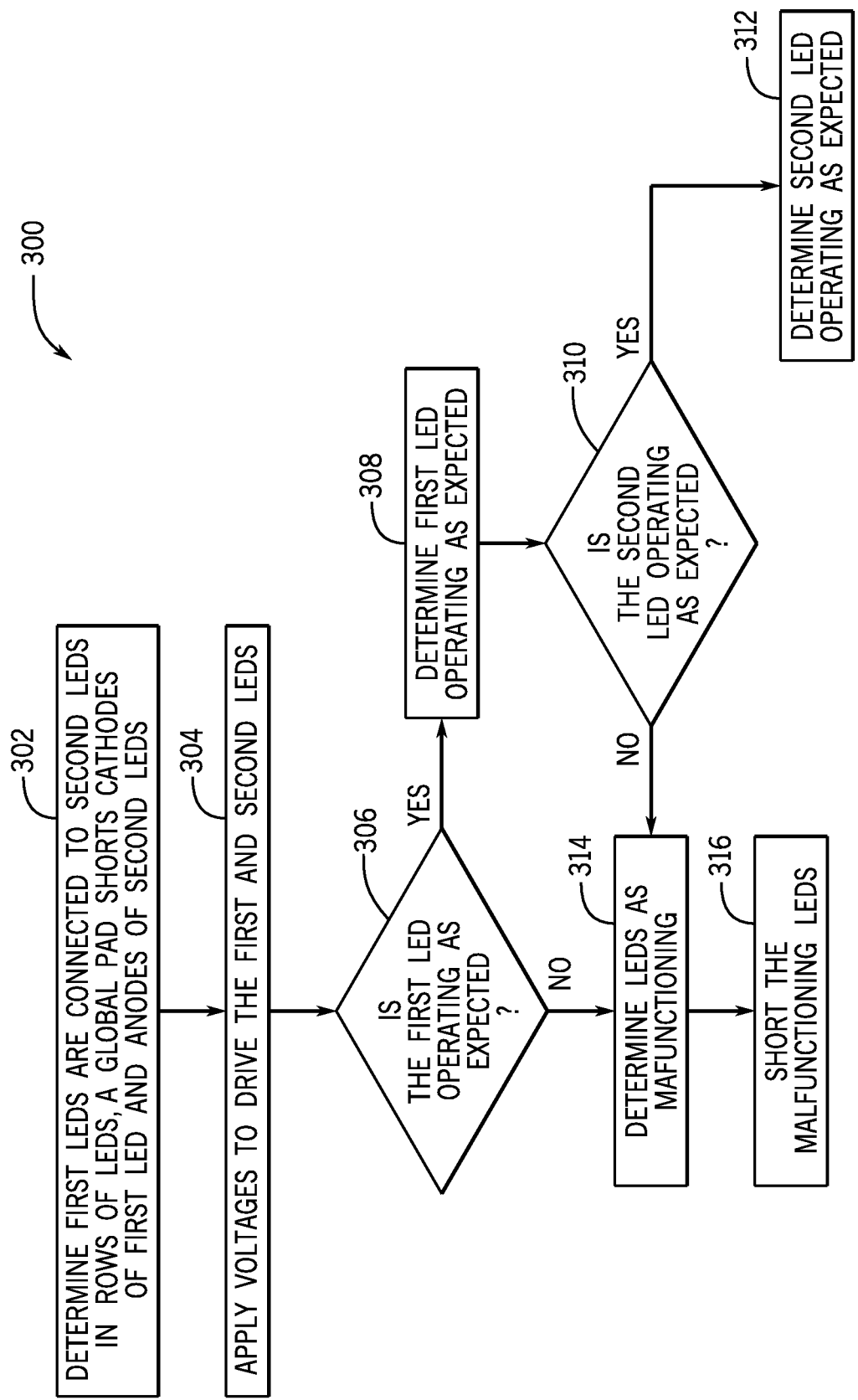
FIG. 15 is a process flow diagram of the global pad shorting of FIG. 11, according to embodiments of the present disclosure.

FIG. 15 is a process flow diagram of a method 300 of the global pad shorting of FIG. 11. At process block 302, the one or more first LEDs 102A may be determined as connected to one or more second LEDs 102B in one or more rows of LEDs 102 of a display 18, as discussed with respect to FIG. 12. Generally, as previously mentioned, the stacked LED circuit 100 may include a global pad 141, in which the global pad 141 may function similarly to the shorting repair discussed with respect to FIG. 9. Additionally, the global pad 141 may be determined as connected to cathodes of the first LEDs 102A of the rows and to the anodes of the second LEDs 102B of the rows of LEDs 102. A shorting bar 142 made of ITO may short the global pad 141 to the µDs 78 and the LEDs 102 of the display 18, as discussed with respect to FIG. 11.

At process block 304, the global pad 141 may be driven with a high voltage, causing each of the second LEDs 102B to emit light. At the same time, the global bad 140 may be driven with a low voltage and each of the first LEDs 102A may emit light. In this manner, identifying which LEDs 102 of each of the rows are properly functioning or malfunctioning, as well as identifying and the exact position of a malfunctioning LED 102 (e.g., a first LED 102A or a second LEDB of a particular row) may be efficiently determined.

As such, at decision block 306, whether the first LED 102A is operating as expected may be determined. That is, are the first LEDs 102 emitting the correct level of brightness and/or providing the luminance for a predetermine duration upon providing current to the LEDs 102. If the LEDs 102 are operating as expected, such as by emitting the expected level of brightness, the first LEDs 102A may be determined as operating as expected at process block 308. Similarly, at decision block 310, whether the second LEDs 102B are operating as expected may be determined. That is, the µDs 78 may drive the LEDs 102 with the current source 107 so that the LEDs 102 emit light. In some embodiments, process blocks 306 and 310 may be performed at the same or approximately the same time. If the second LEDs 102B is functioning as expected (e.g., emitting the correct level of brightness and/or providing the luminance for a predetermine duration), at process block 312, the second LEDs 102B may be determined as operating as expected.

However, if the first LEDs 102A and/or the second LEDs 102B of each row of the display 18 are not operating as expected, such as by emitting light below the expected level of brightness, the LEDs 102 may be determined as malfunctioning LEDs 102 at process block 314. As such, the processor 12 may determine that the display 18 may be determined as needing repair. To repair the malfunctioning LEDs 102, at process block 316, the LEDs 102 that are malfunctioning may be shorted. In particular, the LEDs 102 that are functioning may be selectively etched using a dynamic mask step. That is, the short at the functioning LEDs 102 may be removed (e.g., open the short) by etching while the selected malfunctioning second LED 102B may remain shorted with the ITO material. In some embodiments, to repair the display 18, the short at the malfunctioning second LED 102B may also be removed, and the opened shorts of each of the LEDs 102 may each be replaced with a new ITO short. In such embodiments, when the first LED 102A and the second LED 102B of the third row are driven, the current from the current source 107 may go to the first LED 102A but bypass the second LED 102B.

Figure 16:
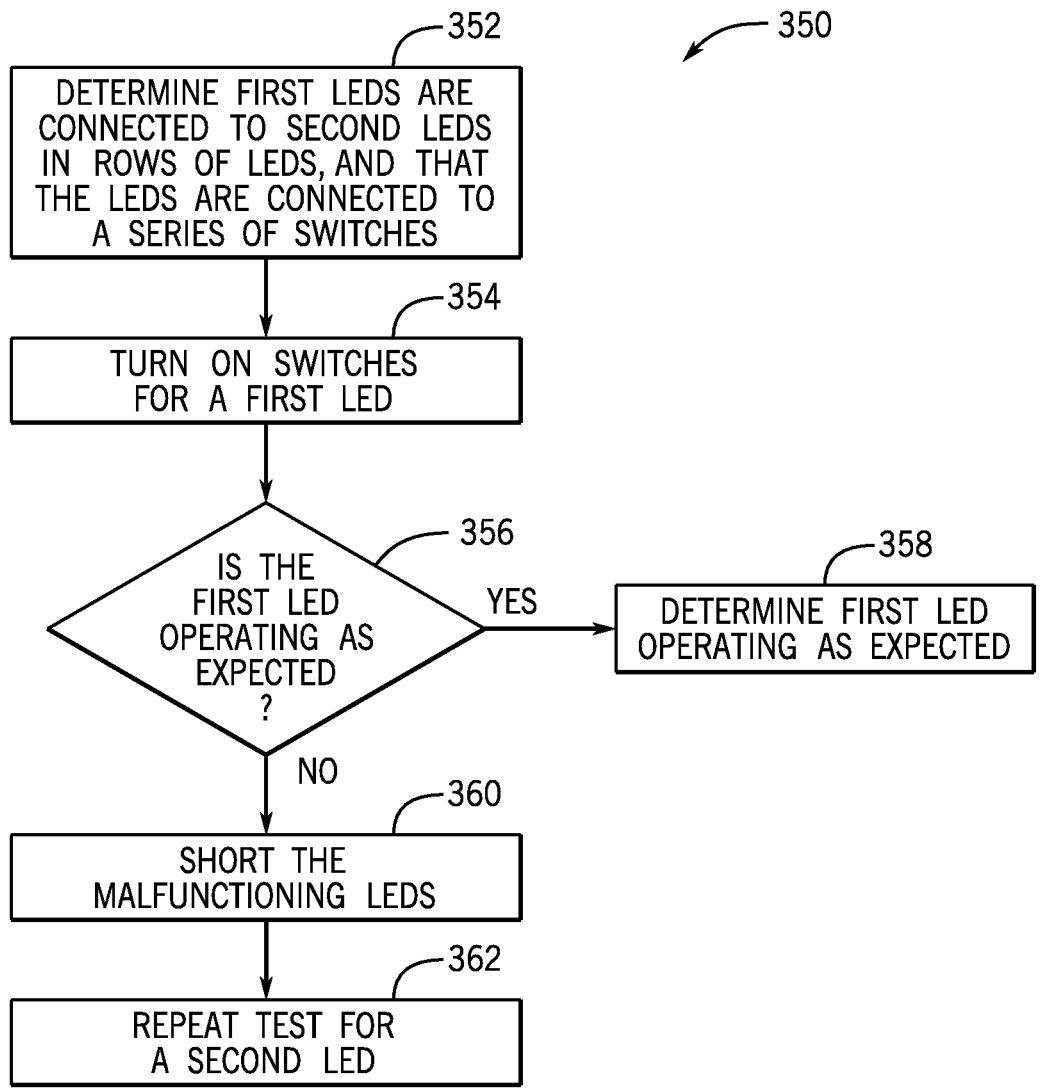
FIG. 16 is a process flow diagram of the electrical shunting of FIG. 12, according to embodiments of the present disclosure.

FIG. 16 is a process flow diagram of a method 350 of electrically shunting the LEDs 102 of FIG. 12. At process block 352, the first LEDs 102A being shorted to the second LEDs 102B may be determined. The LEDs 102 may also be connected to one or more switches 150. The switches 150 may enable testing each of the LEDs 102 individually, one at a time. At process block 354, the switches 150 for to test a particular LED 102 may be turned on (e.g., closed), such as to select a first LED 102A of the first row. Specifically, the switches 150 may connect the µDs 78 to respective LEDs 102 to be driven and/or to a decoder 130. As previously mentioned, the switches 150 are closed (e.g., turned on) to select a particular LED 102 while the switches 150 for all other LEDs 102 remain open (e.g., turned off). The closed path may shunt or direct current to the selected LED 102 and then to the decoder 130. Specifically, the potential for the LED 102 may be known and used to drive the LED 102. That is, the potentials of the respective LEDs 102 may be referred to for driving the selected LED 102 so that the LED 102 may be properly tested for emitting the light. Thus, the display 18 may individually test the LEDs 102 one at a time by selectively closing switches 150 for driving a selected LED 102.

After the current goes through the selected first LED 102A, at decision block 356, whether the first LED 102A is operating as expected may be determined. That is, whether the first LED 102A is emitting light at the intended brightness level, for the intended duration, and so forth, may be determined. If it is, at process block 358, the LED 102 may be determined as operating as expected.

In some embodiments, if the LED 102 is not operating as expected, a laser device may short the LED 102 that is malfunctioning, at process block 360. Thus, the properly functioning LEDs 102 may remain open and ready for use for emitting the light. As previously mentioned, when the malfunctioning LED 102 is removed from the row (e.g., via shorting), then the functioning LED 102 in the row may compensate. For example, the remaining functioning LED 102 in the row may be driven to emit twice the level of brightness for the LED 102. Subsequently, the same test for the second LED 102B in the row may be performed. That is, the respective switches 150 to test the second LED 102B of a row may be coupled for driving the second LED 102B with a known potential for the particular second LED 102B. Any malfunctioning second LEDs 102B may be shorted. As such, using the systems and methods described herein, a stacked LED 102 circuit of the display 18 may facilitate efficiently testing and/or repairing one or more malfunctioning LEDs 102 while reducing power consumption.

Figure 17:
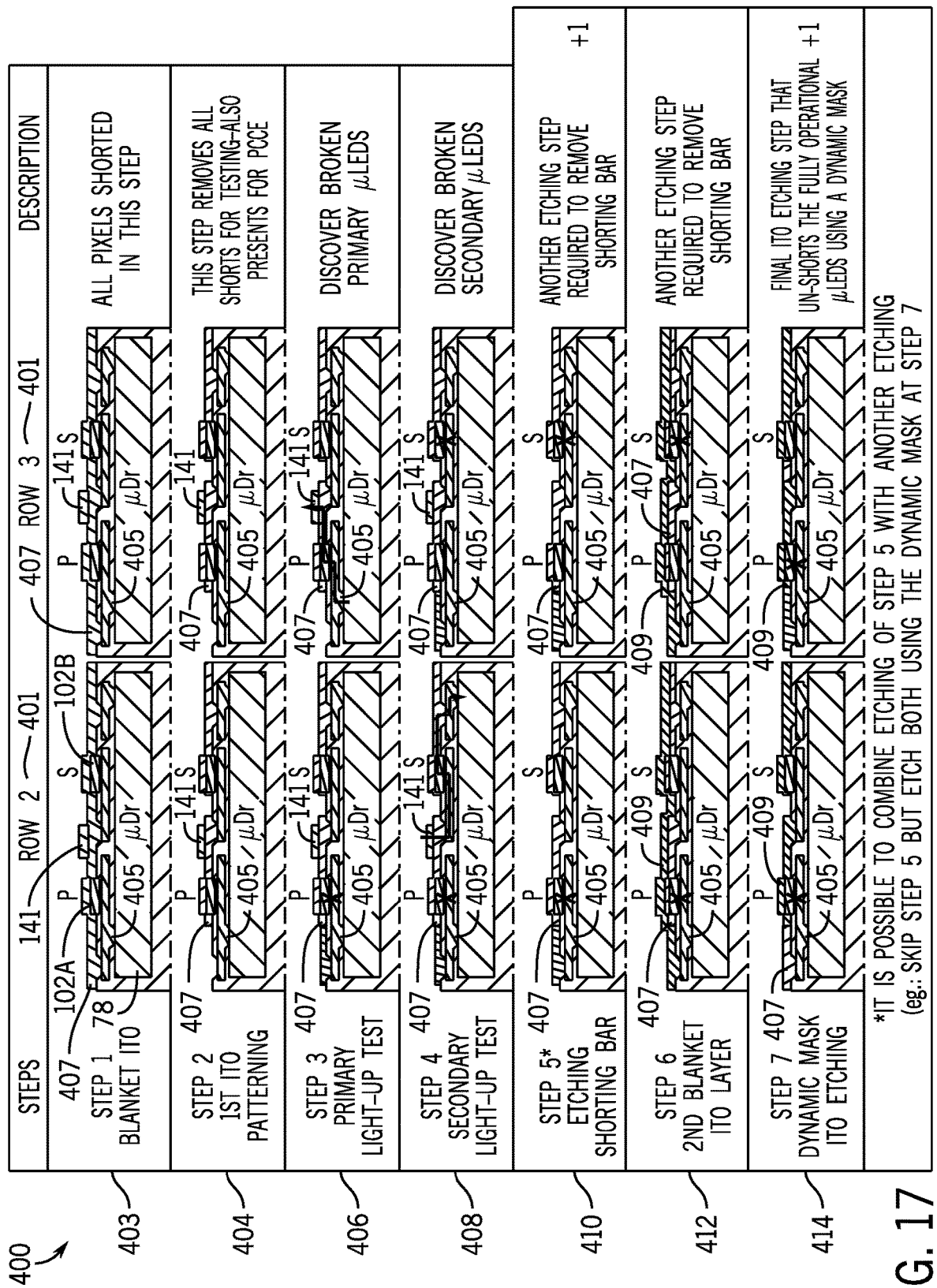
FIG. 17 is a block diagram illustrating a first repair process for repairing malfunctioning LEDs.

FIG. 17 is a block diagram illustrating a first repair process 400 for repairing malfunctioning LEDs 102 using an ITO layer for shorting the malfunctioning LEDs 102. The repair process 400 may involve using the global pad 141, as discussed with respect to FIG. 11 and FIG. 15, effectively removing a malfunctioning LEDs using the shorting bar, as discussed with respect to FIG. 9 and FIG. 13, and repairing the malfunctioning LED using the ITO layer for shorting the malfunctioning LEDs. The display 18 may include two rows, a first row 401 (Row 2) and a second row 402 (Row 3), each with a first LED 102A and a second LED 102B that are controlled by one or more µDs 78. As shown, at a first step 403 (Step 1), a first blanket ITO layer 407 of ITO or similar material may be placed over the first LEDs and the second LEDs 102B of each of the rows including the first row 401 and the second row 402. By placing a blanket layer of ITO over the first LEDs and the second LED 102B, each of the LEDs 102 may be shorted (e.g., all pixels are shorted). At a second step 404 (Step 2), ITO patterning is performed, in which some of the ITO is removed in a patterning path so that the LEDs 102 may be tested. That is, the shorts are removed. In particular, a µD 78 may connect to the first LED 102A and the second LED 102B through the patterning path so that the µD 78 may drive the LEDs 102 (e.g., of a row). The patterning path includes a conductive or metal layer 405. The patterning path may also pass through the first blanket ITO layer 407 on top of the first metal layer 405, pass back through the first blanket ITO layer 407 and the metal layer 405, and then to an anode of the second LED 102B. The second LED 102A is driven in series with the first LED 102A. The patterning path passes back to the µD 78, and as such, the shorts are opened.

At a third step 406 (Step 3), the first LEDs 102A of the entire display (e.g., of each rows including the first row 402 and the second row 403) may be driven by the µDs 78 so that the display 18 may emit light (e.g., light-up test is performed) at the first LEDs 102A. If the first LEDs 102 in the rows, such as the first row 401 and/or the second row 402, do not emit light, the first LEDs A102 may be identified as malfunctioning LEDs 102.

In particular, the global pad 141 may isolate the first LEDs 102A and the second LEDs 102B by loads (e.g., larger or smaller loads for the first or the second LEDs 102A, 102B). The global pad 141 may also include ITO or similar materials. The global pad 141 may connect to each of the µDs 78 driving the first LED 102A and the second LED 102B in a respective row, and the global pad 141 may be set to a voltage potential for the first LED 102A or the second LED 102B. In the second row 402, the µD 78 may drive the first LED 102A through a path connecting the µD 78 to the first LED 102A, through the first blanket ITO layer 407, back to the global pad 141, and back to the µD 78 before connecting to the second LED 102B. In the depicted embodiment, the first LED 102A of the first row 401 may be a malfunctioning LED 102 and as such, current may not pass through the path connecting the µD 78 to the first LED 102A. Since the first LED 102 is a malfunctioning LED, the first LED 102A may not light up when driven by the µD 78.

At a fourth step 408 (Step 4), the second LEDs 102B of each of the rows may be tested. The global pad 141, which isolates the first LEDs 102A and the second LEDs 102B by the load, may be set to a high voltage. The second LEDs 102B may be driven similarly to the first LEDs 102, as described with respect to the third step 406. If the second LEDs 102B are operating as expected, the current from the µD 78s may pass through the global pad 141. Here, since the first LED 102A of the first row 401 is malfunctioning, the first LED 102A is disconnected since there is no current source driving it (e.g., based on the large load). The first LEDs 102A may be driven by the cathodes of the LEDs 102, so when the high voltage is applied to the cathodes, the cathodes may not turn on (e.g., emit light).

The second LEDs 102B may be forward bias so when the second LEDs 102B are operating as expected, the second LEDs 102B may pass the current back to the respective µDs 78. In the depicted embodiment, the second LED 102B of the second row 402 is malfunctioning. Thus, the first LEDs 102A and the second LEDs 102B of each of the rows (e.g., LEDs 102 of the entire display 18), including the first row 401 and the second row 402, may be determined as operating as expected or as malfunctioning LEDs 102 using the first step 403 through the fourth step 408 (e.g., 403, 404, 406, and 408).

At a fifth step 410 (Step 5), a shorting bar may be etched away. As previously mentioned, each of the LEDs 102 are shorted at the first step 403. At this step, the shorting bar for each of the malfunctioning LEDs 102 may be etched away in preparation for repairing the malfunctioning LEDs 102. At a sixth step 412 (Step 6), a second blanket ITO layer 409 may be placed over the top layer that may include the first blanket ITO layer 407, removed shorts, etc. In particular, the second blanket ITO layer 409 may be used for shorting the LEDs 102 for repair. In some embodiments, certain regions may allow the first LEDs 102A and the second LEDs 102B to be shorted. At a seventh step 414 (Step 7), shorts from second blanket ITO layer 409 may be etched away from the LEDs 102 that are operating as expected while the malfunctioning LEDs 102 may remain shorted. As such, the µD 78 in the second row 401 that may drive the first LED 102A and the second LED 102B, may pass current through the deposited second blanket ITO layer 409 (e.g., shorting layer for repairs), then pass down through the metal layer 405, and then pass through to the second LED 102B. In the second row 402, the first LED 102A may operate as expected while the second LED 102B may be a malfunctioning LED, as previously discussed. The µD 78 may drive the first LED 102A and the LED 102B. However, since the second LED 102B is malfunctioning, the current may not pass through the metal layer 405 and instead, may pass through short from the first blanket ITO layer 407 to the second blanket ITO layer 409, and return back to the µD 78. In some embodiments, the fifth step 410 may be skipped and/or combined with the seventh step 414.

Figure 18:
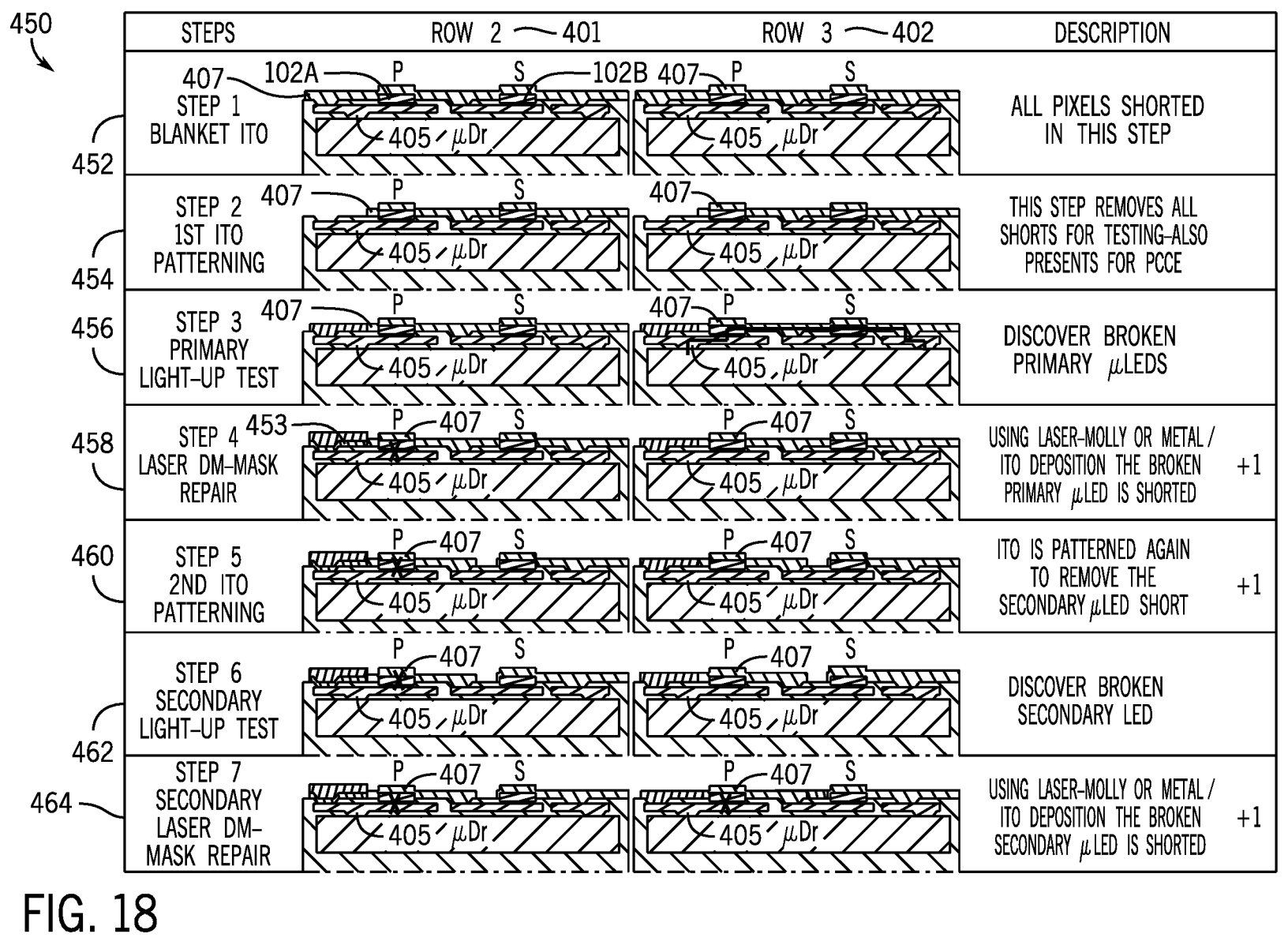

FIG. 18 is a block diagram illustrating a second repair process 450 for sequentially identifying and repairing malfunctioning LEDs 102A using a moly or an ITO layer for shorting the malfunctioning LEDs 102 (e.g., without using the shorting bar). At a first step 452 (Step 1) a first blanket ITO layer 407 of ITO or similar material may be placed over the first LEDs and the second LEDs 102B of the rows of the display 18, including the first row 401 and the second row 402. Each of LEDs (e.g., all of the pixels) may be shorted at this step. At a second step 454 (Step 2), a first ITO patterning is performed, in which some of the ITO is removed in a patterning path so that the LEDs 102 may be tested. That is, the short may be removed to test the LEDs 102, such as the first LEDs 102A. At a third step 406 (Step 3), the first LEDs 102A of the entire display (e.g., of each rows including the first row 402 and the second row 403) may be driven by the µDs 78 so that the display 18 may emit light (e.g., light-up test is performed) at the first LEDs 102. In particular, the current from a µD 78 driving the first LED 102A and the second LED 102A of a respective row may pass current through the µD 78. Since the second LED 102B is still shorted (e.g., not open), the current may only pass through the first LED 102A. If first LED 102A is malfunctioning, the current may also not flow through the first LED 102A (e.g., no current through any of the LEDs 102 of the row).

At a fourth step 458 (Step 4), upon identifying a malfunctioning first LED 102A, such as the first LED 102A of the first row 401, a laser moly layer 453 or similar materials (e.g., ITO and/or similar metal) may be deposited over the first LED 102A. The laser moly layer 453 may enable testing the first LED 102A and the second LED 102B. As previously mentioned, if the first LED 102A is malfunctioning, current may not flow through. However, the laser moly layer 453 may enable the current to pass through the moly and short the first LED 102A, and then enables the current to flow back to μD 78. Similar steps may be repeated for repairing the second LEDs 102B.

In particular, at a fifth step 460 (Step 5), a second ITO patterning step may be performed to remove ITO from the second LEDs 102B so that the second LEDs 102B may be tested. The ITO may be removed as discussed with respect to the second step 454 and/or the second step 404 of FIG. 17. At a sixth step 462 (Step 6), the second LEDs 102B of the entire display (e.g., of each rows including the first row 402 and the second row 403) may be driven by the μDs 78 so that the display 18 may emit light (e.g., light-up test is performed) at the second LEDs 102B. By way of example, current from the μD 78 driving the second LED 102B of the second row 402 may pass through the moly, bypass the first LED 102A that was repaired and pass to the second LED 102B. The current may pass through the first blanket ITO layer 407, the metal layer 405, and back to the μD 78 of the pad of μD 78s. Thus, light may emit from the second LED 102B if it is operating as expected. However, at the second row 402, no current may be received the malfunctioning second LED 102B. At this point, the first LED 102A of the second row 402 may be identified as operating as expected based on the light-up test for the first LED 102A (e.g., light is emitted). The second LED 102B may also be classified at this point as operating as expected or malfunctioning. That is, since the ITO or short has been removed for the second LED 102B and the first and the second LEDs 102 are in series, the second LED 102B may be classified.

Based on this test, the second LED 102B of the second row 402 may be identified as malfunctioning, and thus, there may be no current to the second LED 102B. Since the second LED 102B light up when the second LEDs 102 were shorted in the third step 456, the second LED 102B ma be easily and efficiently identified as malfunctioning. Thus, the second row 402 may also be efficiently repaired. In particular, at a seventh step 464 (Step 7), a second laser moly layer may be deposited at the second LED 102B, as discussed with respect to step 412 of FIG. 17. The second LED 102B may be shorted for repair, as discussed with respect to FIG. 18.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A display system, comprising:
   a plurality of primary light emitting diodes configurable to emit light, wherein the plurality of primary light emitting diodes are coupled to a common anode, and wherein at least a first primary light emitting diode of the plurality of primary light emitting diodes is shorted; and
   a plurality of secondary light emitting diodes configurable to emit light, wherein at least a first secondary light emitting diode of the plurality of secondary light emitting diodes associated with the first primary light emitting diode is configured to be driven with twice as much current based at least in part on the first primary light emitting diode being shorted, wherein each primary light emitting diode of the plurality of primary light emitting diodes is coupled in series with a respective secondary light emitting diode of the plurality of secondary light emitting diodes.

2. The display system of claim 1, comprising:
   a second primary light emitting diode of the plurality of primary light emitting diodes, the second primary light emitting diode configured to emit light; and
   a second secondary light emitting diode of the plurality of secondary light emitting diodes configured to emit light, wherein the second secondary light emitting diode is associated with the second primary light emitting diode, and wherein the first primary light emitting diode being shorted causes the first secondary light emitting diode to be driven with twice an amount of current as the second primary light emitting diode or the second secondary light emitting diode.

3. The display system of claim 1, comprising one or more drivers,
   wherein the plurality of primary light emitting diodes and the plurality of secondary light emitting diodes are driven at a same time by the one or more drivers.

4. The display system of claim 1, wherein the first primary light emitting diode is shorted using a metal imprint.

5. The display system of claim 4, wherein the metal imprint comprises moly.

6. The display system of claim 4, wherein the metal imprint allows current to pass through to short the first primary light emitting diode.

7. The display system of claim 1, wherein a second primary light emitting diode and a second secondary light emitting diode are driven with half as much current based at least in part on the second primary light emitting diode and the second secondary light emitting diode being functional.

8. The display system of claim 1, comprising a first transistor and a second transistor coupled in a cascode formation, wherein the first primary light emitting diode and the first secondary light emitting diode are coupled in series with the first transistor and the second transistor.

9. The display system of claim 1, comprising a pre-charge voltage switch, wherein the plurality of primary light emitting diodes and the plurality of secondary light emitting diodes are configured to be pre-charged based at least in part on closing the pre-charge voltage switch.

10. A display, comprising:
    a first light emitting diode of a first plurality of light emitting diodes configurable to emit light, wherein the first plurality of light emitting diodes are coupled to a common anode; and a second light emitting diode of a second plurality of light emitting diodes configurable to emit light as a backup for the first light emitting diode, wherein the first light emitting diode being dim upon receiving current causes the second light emitting diode to be driven with twice as much current, and wherein each light emitting diode of the first plurality of light emitting diodes is coupled in series with a respective light emitting diode of the second plurality of light emitting diodes.

11. The display of claim 10, wherein the first light emitting diode comprises a malfunctioning light emitting diode based at least in part on an expected luminance level, a luminance duration, or both.

12. The display of claim 11, wherein the first light emitting diode comprising the malfunctioning light emitting diode is based at least in part on a placement on the display, a bonding to the display, or a combination thereof.

13. The display of claim 10, wherein the first light emitting diode is shorted.

14. The display of claim 13, wherein the shorted first primary-light emitting diode comprises moly, indium tin oxide, or both.

15. A method comprising:
  determining, via a processor, a first light emitting diode (LED) of a first plurality of LEDs is connected in series to a second LED of a second plurality of LEDs, wherein the first plurality of LEDs are coupled to a common anode, and wherein each first LED of the first plurality of LEDs is coupled in series to a respective second LED of the second plurality of LEDs;
  applying, via the processor, a voltage to test the first LED and the second LED;
  determining, via the processor, that the first LED is malfunctioning based at least in part on determining the first LED is not operating as expected; and
  shorting, via the processor, the first LED to cause twice as much current to be driven through the second LED.

16. The method of claim 15, comprising determining, via the processor, that the second LED is operating as expected based at least in part on determining the second LED is emitting light at an expected luminance level, a luminance duration, or both.

17. The method of claim 15, wherein shorting, via the processor, the first LED comprises depositing a laser moly layer over the first LED.

18. The method of claim 17, comprising:
  driving, via the processor, through the first LED and the second LED, wherein the laser moly layer enables current to pass through to the second LED.

19. The method of claim 15, comprising:
  causing, via the processor, the first LED to be coupled to negative voltage and the second LED to be coupled to a bias voltage prior to applying the voltage to test the first LED and the second LED.

20. The method of claim 15, wherein determining, via the processor, that the first LED is malfunctioning comprises the first LED being dim when receiving current.

* * * * *

UNITED STATES PATENT AND TRADEMARK OFFICE
CERTIFICATE OF CORRECTION

| | | |
|---|---|---|
| PATENT NO. | : 12,254,799 B2 | Page 1 of 1 |
| APPLICATION NO. | : 17/887148 | |
| DATED | : March 18, 2025 | |
| INVENTOR(S) | : Thomas Charisoulis et al. | |

It is certified that error appears in the above-identified patent and that said Letters Patent is hereby corrected as shown below:

In the Claims

Column 21, Claim 14, Line 21, please remove the word "primary-" before the "light".

Signed and Sealed this
Sixteenth Day of September, 2025

Coke Morgan Stewart
*Acting Director of the United States Patent and Trademark Office*